(12) United States Patent
Maki et al.

(10) Patent No.: US 7,115,482 B2
(45) Date of Patent: Oct. 3, 2006

(54) METHOD OF MANUFACTURING SEMICONDUCTOR DEVICE

(75) Inventors: Hiroshi Maki, Ryuou (JP); Hideyuki Suga, Hamura (JP)

(73) Assignees: Renesas Technology Corp., Tokyo (JP); Renesas Eastern Japan Semiconductor, INC, Tokyo (JP)

( * ) Notice: Subject to any disclaimer, the term of this patent is extended or adjusted under 35 U.S.C. 154(b) by 160 days.

(21) Appl. No.: 10/942,889

(22) Filed: Sep. 17, 2004

(65) Prior Publication Data

US 2005/0059205 A1   Mar. 17, 2005

(30) Foreign Application Priority Data

Sep. 17, 2003   (JP)   ............................ 2003-324838
Jul. 7, 2004    (JP)   ............................ 2004-200101

(51) Int. Cl.
*H01L 21/30* (2006.01)

(52) U.S. Cl. .................. 438/459; 438/33; 438/50; 438/52

(58) Field of Classification Search .......... 438/33, 438/50, 52, 113, 456, 458, 459
See application file for complete search history.

(56) References Cited

U.S. PATENT DOCUMENTS 5,668,033 A * 9/1997 Ohara et al. ................. 438/113

FOREIGN PATENT DOCUMENTS

JP          2000-353710          12/2000

* cited by examiner

*Primary Examiner*—Mai-Huong Tran
(74) *Attorney, Agent, or Firm*—Antonelli, Terry, Stout and Kraus, LLP.

(57) ABSTRACT

Extremely thin chips laminated to a non-ultraviolet ray curing type adhesive tape are peeled from the tape without giving rise to cracks and chippings. In a center portion of a suction block used for peeling off a chip laminated to a dicing tape, three blocks which push the dicing tape upwardly are incorporated. With respect to these blocks, inside the first block having a largest diameter, there is a second block having a diameter smaller than the diameter of the first block. Further, inside the second block, there is a third block having the smallest diameter. To peel off a chip by pushing a back surface of the dicing tape with the blocks, first of all, the three blocks are simultaneously pushed upwardly by a certain amount and, thereafter, the intermediate block and the inner block are further pushed upward, and, finally, the inner block is further pushed upward.

25 Claims, 42 Drawing Sheets

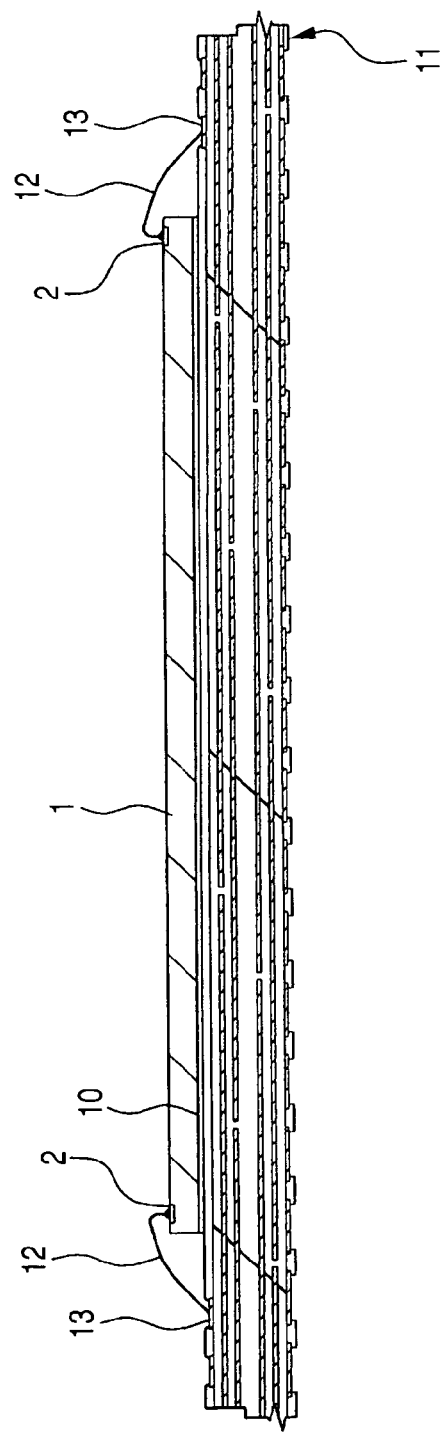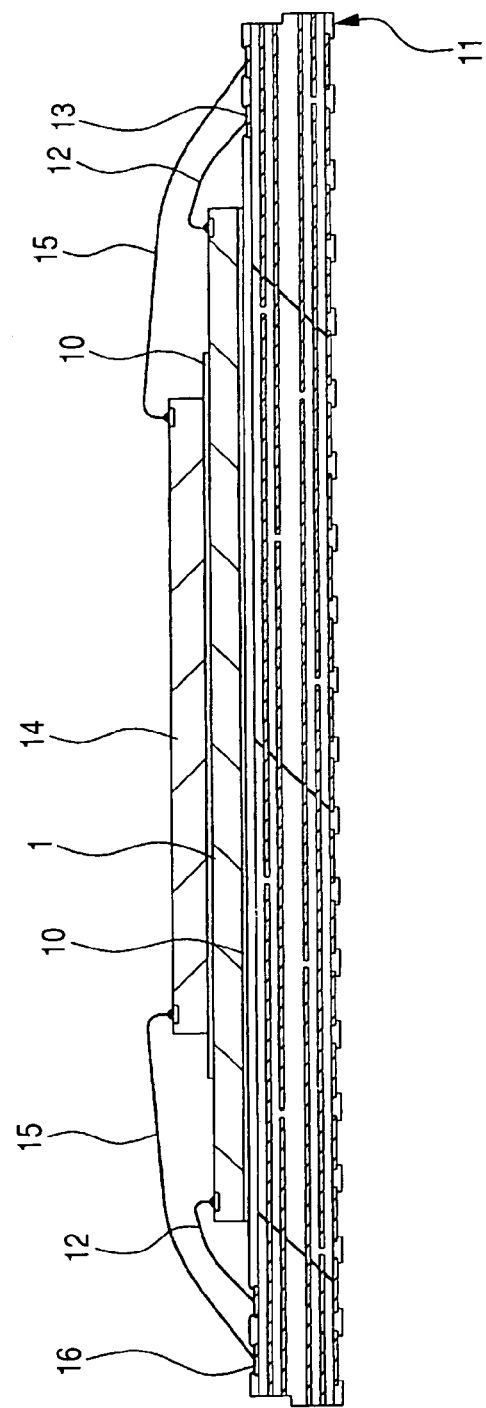

METHOD OF MANUFACTURING SEMICONDUCTOR DEVICE

CROSS-REFERENCE TO RELATED APPLICATION

The present application claims priority from Japanese patent application JP 2003-324838, filed on Sep. 17, 2003, the content of which is hereby incorporated by reference into this application.

BACKGROUND OF THE INVENTION

The present invention relates to a technique for use in the manufacture of a semiconductor device, and, more particularly, to a technique which is effective when applied to steps in which a semiconductor wafer adhered to an adhesive tape is divided into a plurality of semiconductor chips by dicing, and, thereafter, the respective semiconductor chips are peeled off from the adhesive tape.

Recently, with a view toward enhancement of high-density packaging of a semiconductor device, a stacked package which three-dimensionally mounts plural sheets of semiconductor chips on a printed circuit wiring board has been put into practice. However, in assembling such a stacked package, semiconductor chips (hereinafter, simply referred to as "chips"), which are processed such that the thickness of the semiconductor chip is reduced to approximately several tens of µm, are used.

In mounting such thin chips on a printed circuit wiring board, first of all, on a main surface of a semiconductor wafer (hereinafter, simply referred to as "wafer") which forms a desired integrated circuit, a tape which protects the integrated circuit is laminated. In such a state, by polishing or etching a rear surface of the wafer, the thickness of the wafer is decreased to approximately several tens of µm. Then, dicing is performed, while the adhesive tape remains laminated to the rear surface of the thin wafer, so as to divide the wafer into a plurality of chips. Thereafter, the rear surface of the adhesive tape is pushed up by the pusher pins or the like to peel off the chips one after another from the adhesive tape. The peeled chips are picked up by a collet and are transported to the printed circuit wiring board, where pellet bonding is performed.

Here, in the above-mentioned package assembling steps, which involve the use of extremely thin chips, when the chips which are divided by dicing are peeled or are picked up from the adhesive tape, cracks or chippings are liable to easily occur on the chips, and, hence, it is necessary to provide measures to prevent the occurrence of these cracks or chippings.

The Japanese Unexamined Patent Publication 2000-353710 (patent literature 1) discloses a technique to peel off extremely thin chips (pellets), which cannot be picked up by a push-up operation using a pusher pin, from a dicing tape. The pellet pickup device which is disclosed in this patent literature 1 has a profile of a size larger than the chip which becomes an object to be picked up at the center of an upper portion of a backup holder, and a groove portion on which the outer peripheral end of the chip is arranged when the chip is mounted on the backup holder is formed along the outer periphery of the chip, wherein by evacuating air inside the groove portion, it is possible to peel off the chip from the peripheral end portion thereof.

Patent Literature 1
Japanese Unexamined Patent Publication 2000-353710

SUMMARY OF THE INVENTION

The adhesive tape used in dicing a wafer is roughly classified into an ultraviolet (UV) curing type and a non-ultraviolet (UV) curing type. When the ultraviolet (UV) curing type adhesive tape is used, a wafer which is laminated to an adhesive tape is diced, and, thereafter, ultraviolet rays are irradiated from a back surface side of the adhesive tape so as to cure an adhesive on the tape, thus decreasing the adhesive strength of the adhesive to make it easier to peel the chips from the adhesive tape. However, the ultraviolet (UV) curing type adhesive tape has a disadvantage in that it is costly compared to the non-ultraviolet (UV) curing type adhesive tape. Further, among integrated circuits formed in the chip, there exists an integrated circuit, such as a flash memory, for example, which experiences a change in characteristic due to irradiation of ultraviolet rays. Accordingly, in dicing a wafer in which such integral circuits are formed, it is desirable to use the non-ultraviolet (UV) curing type adhesive tape.

However, in contrast to the ultraviolet (UV) curing type adhesive tape, it is impossible reduce the adhesive strength of the non-ultraviolet (UV) curing type adhesive tape by curing the adhesive, and, hence, it is difficult to peel chips off of the non-ultraviolet (UV) curing type adhesive tape compared to the ultraviolet (UV) curing type adhesive tape.

When the chips are adhered to such a non-ultraviolet (UV) curing type adhesive tape, even when the peeling-off of the chips is attempted by applying an ultrasonic vibration from the back surface side of the adhesive tape, for example, since the adhesive strength of the adhesive is strong, the chips which are at first peeled off may again adhere to the adhesive tape due to the vibration. Further, the inventors of the present invention also have recognized the following drawbacks. That is, even when the peeling-off of the chips is attempted by pushing a pusher pin provided with a large number of needles against the back surface of the adhesive tape, the peeling-off operation requires a considerable time. Alternatively, when thin chips are adopted, the chips cannot withstand a bending stress and will tend to crack.

Accordingly, it is an object of the present invention to provide a technique which can speedily peel off extremely thin chips which are laminated to an adhesive tape without generating cracks and chippings.

The above-mentioned object, other objects and novel features of the present invention will become apparent from the description provided in this specification and the attached drawings.

A summary of representative aspects of the invention disclosed in this specification is as follows.

A method of manufacturing a semiconductor device in accordance with the present invention includes the steps of:

adhering an adhesive tape to a back surface of a semiconductor wafer having integrated circuits formed on a main surface thereof, and, thereafter, dicing the semiconductor wafer to thereby divide the semiconductor wafer into a plurality of semiconductor chips; and applying an upward load to the adhesive tape below a semiconductor chip, which represents an object to be peeled off, among the plurality of semiconductor chips that adhere to the adhesive tape, in a state in which an upper surface of the semiconductor chip, which is an object to be peeled off, is sucked and held by a suction collet, to thereby peel off the semiconductor chip from the adhesive tape, wherein the step of applying a load to the adhesive tape includes:

a step of preparing a first pusher block having a first upper surface and a corner portion around the first upper surface, and a second pusher block having a second upper surface which is arranged inside the first upper surface and a corner portion around the second upper surface;

a first step of pushing the adhesive tape upwardly by making the first and second upper surfaces simultaneously push the back surface of the adhesive tape, and a second step of further pushing the adhesive tape upwardly by pushing up the second upper surface higher than the first upper surface after the first step.

Advantageous effects obtained by the present invention as described in this specification are as follows.

At the time of peeling off the respective semiconductor chips from the adhesive tape after dividing the plurality of semiconductor chips by dicing the semiconductor wafer laminated to a UV curing type tape or a non-UV curing type tape, even when the chips are extremely thin, it is possible to peel off these chips without generating cracks and chippings.

BRIEF DESCRIPTION OF THE DRAWINGS

FIG. 24 is a cross-sectional view of a printed circuit wiring board showing a step of pellet bonding of the semiconductor chips;

FIG. 25 is a cross-sectional view of a printed circuit wiring board showing steps of stacking and wire bonding of the semiconductor chips;

DETAILED DESCRIPTION OF THE PREFERRED EMBODIMENTS

Preferred embodiments of the present invention will be described in detail in conjunction with the attached drawings hereinafter. In all of the drawings, the same symbols are given to identical parts and their repeated explanation is omitted.

(Embodiment 1)

This embodiment is applied to the manufacture of a semiconductor package which mounts chips on a printed circuit wiring board. A method of manufacture of the semiconductor package will be explained in the order of the steps thereof in conjunction with FIG. 1 to FIG. 25.

Figure 1:
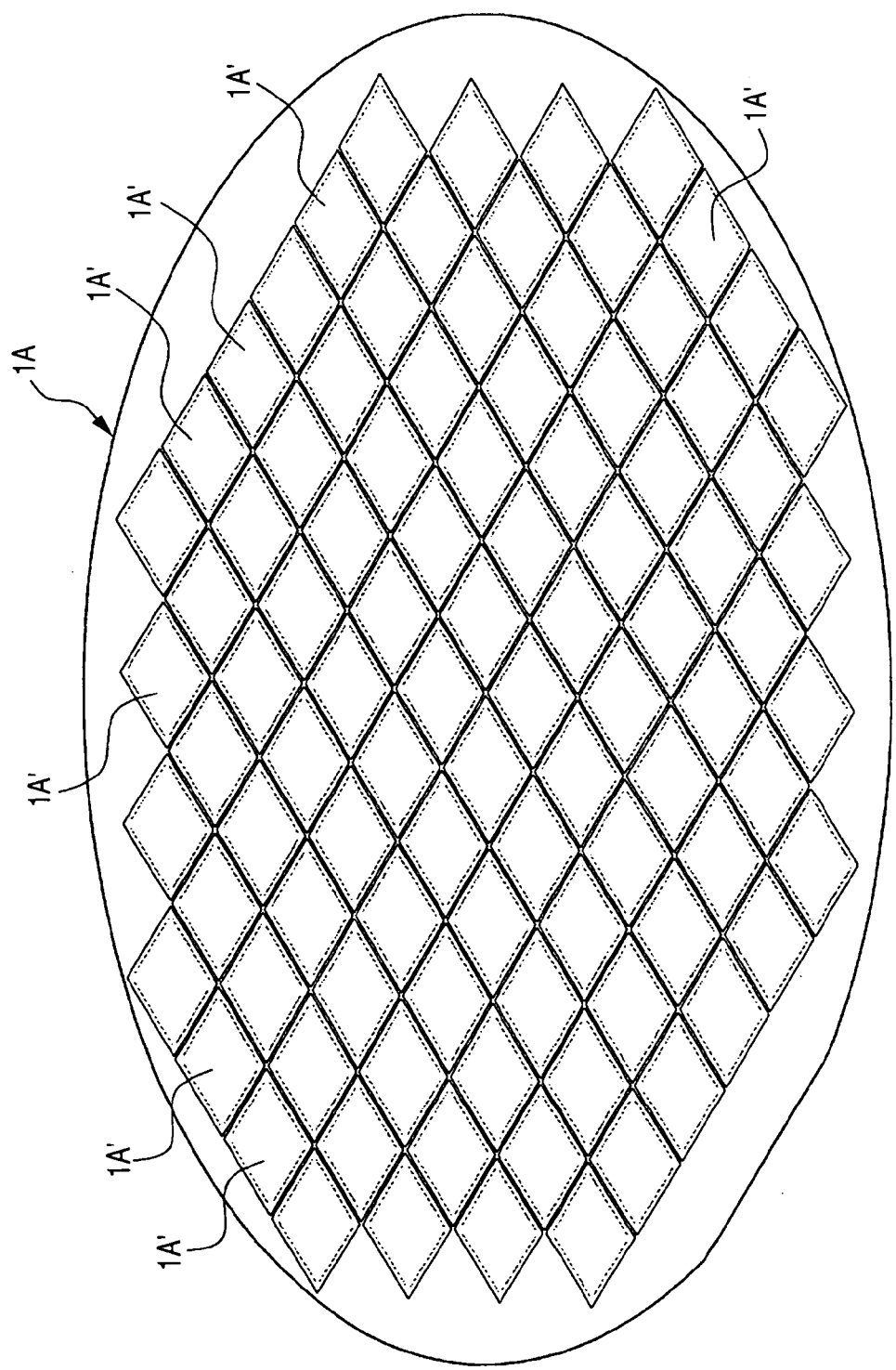
FIG. 1 is a perspective view of a wafer of semiconductor chips in the manufacture of semiconductor devices according to one embodiment of the present invention.

First of all, an integrated circuit is formed over a main surface of a wafer 1A made of single crystal silicon, as shown in FIG. 1, in accordance with a well-known manufacturing process; and, thereafter, an electric test is performed on integrated circuits which are respectively formed on a plurality of chip forming regions 1A', which are defined by grid-like scribe lines, so as to judge whether respective chip forming regions 1A' are defective or non-defective. The chip forming region 1A' used in this embodiment has a square planar shape, with longitudinal and lateral lengths which are equal.

Figure 2:
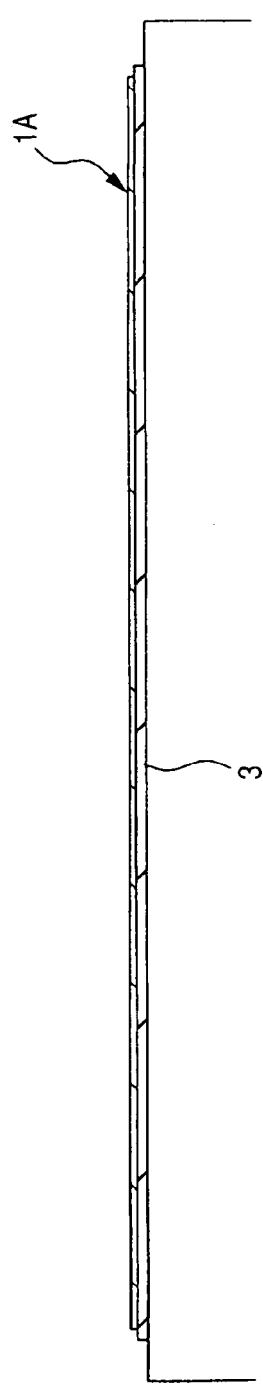
FIG. 2 is a side view showing a step of polishing a semiconductor wafer.

Next, as shown in FIG. 2, a back grind tape 3 for protecting the integrated circuit is laminated to the integrated circuit forming surface (the lower surface side as seen in the drawing) of the wafer 1A. The back surface (the upper surface side as seen in the drawing) of the wafer 1A is ground using a grinder in this state, and, thereafter, a damaged layer which is generated by grinding on the back surface of the wafer 1A is removed by a method such as wet etching, dry polishing or plasma etching, thus decreasing the thickness of the wafer 1A to 100 μm or less, for example, to approximately 50 μm to 90 μm. Although a method, such as the above-mentioned wet etching, dry polishing, plasma etching or the like, exhibits a low processing speed, which advances in the thickness direction of the wafer, compared to the grinding speed of grinding using a grinder, the damage to the inside of the wafer caused by such processing is small compared to grinding using a grinder, and, at the same time, the damaged layer which is generated in the inside of the wafer by grinding using a grinder can be removed, thus bringing about the advantageous effect that the wafer 1A and the chips are hardly cracked.

Figure 3:
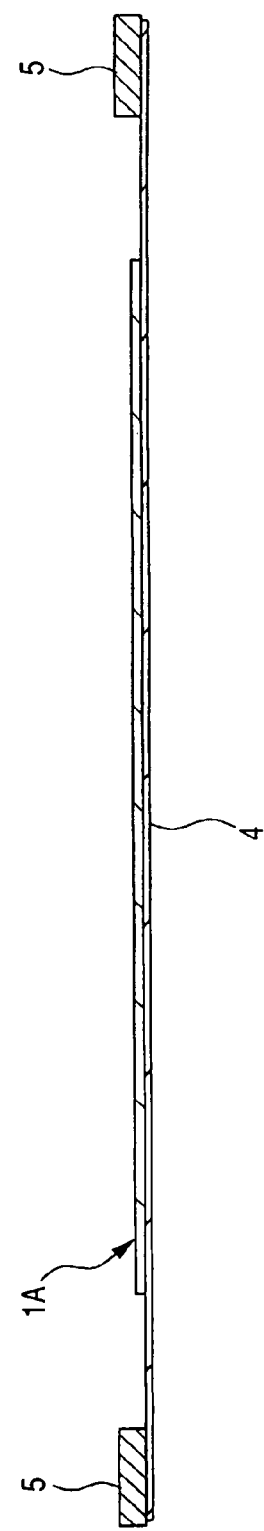
FIG. 3 is a side view showing a step of laminating a dicing tape to the semiconductor wafer.

Next, after removing the back grind tape 3, as shown in FIG. 3, a dicing tape 4 is laminated to the back surface (the surface opposite to the surface on which the integrated circuit is formed) of the wafer 1A, and a peripheral portion of the dicing tape 4 is fixed to a wafer ring 5 in such a state. The dicing tape 4 is formed by cutting a UV curing type adhesive tape in a circular shape, which tape has a tackiness due to the application of a pressure sensitive adhesive to a surface of a tape substrate made of polyolefin (PO), polyvinylchloride (PVC), or polyethylene terephthalate (PET).

Figure 4:
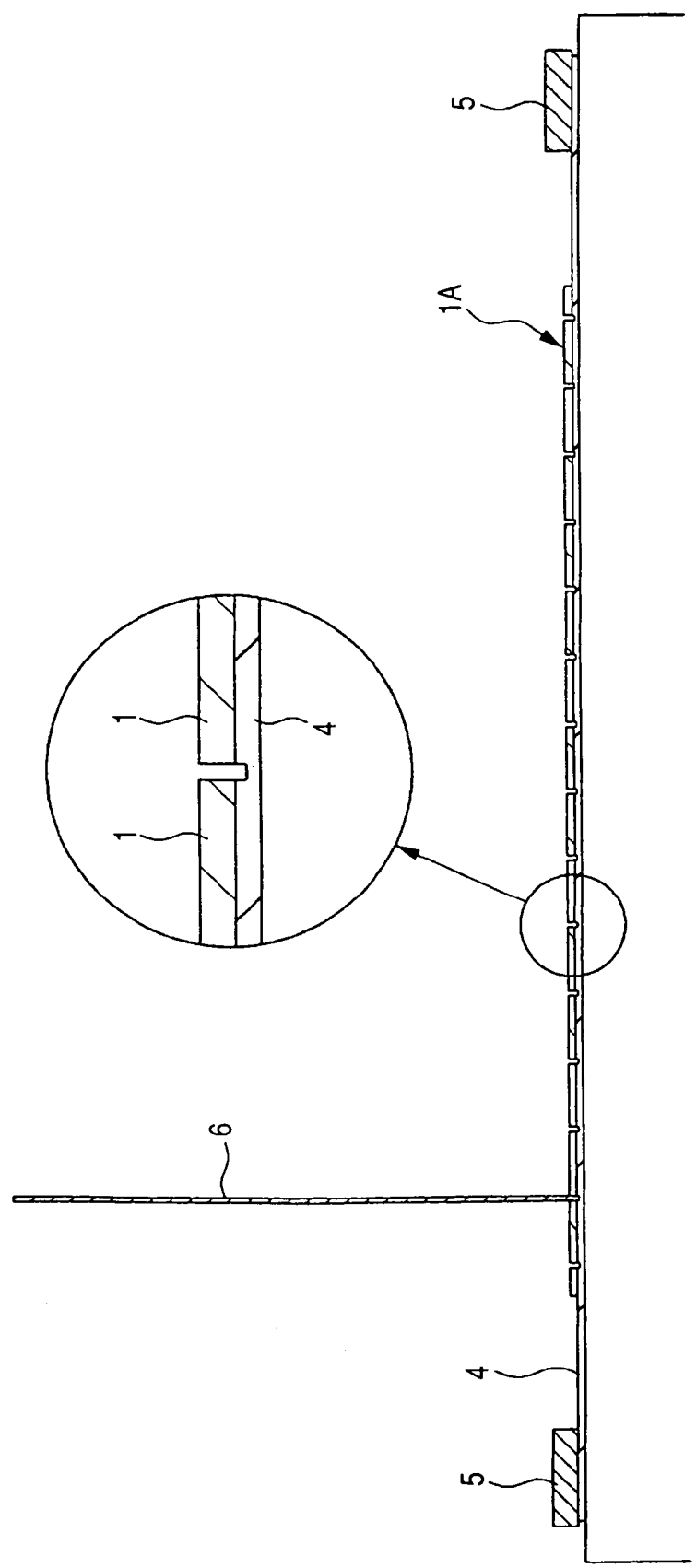
FIG. 4 is a side view showing a step of dicing the semiconductor wafer.

Next, as shown in FIG. 4, the wafer 1A is diced using a well-known dicing blade 6 to divide the plurality of respective chip forming regions 1A' into square chips 1. Since it is necessary to leave the respective divided chips 1 on the circular dicing tape 4, the dicing tape 4 is cut substantially half way in the thickness direction thereof. Here, when a UV curing type adhesive tape is used as the dicing tape 4, prior to the peeling-off step of the chip 1 explained hereinafter, ultraviolet rays are irradiated to the dicing tape 4, thus lowering the adhesive strength of the pressure sensitive adhesive.

Figure 5:
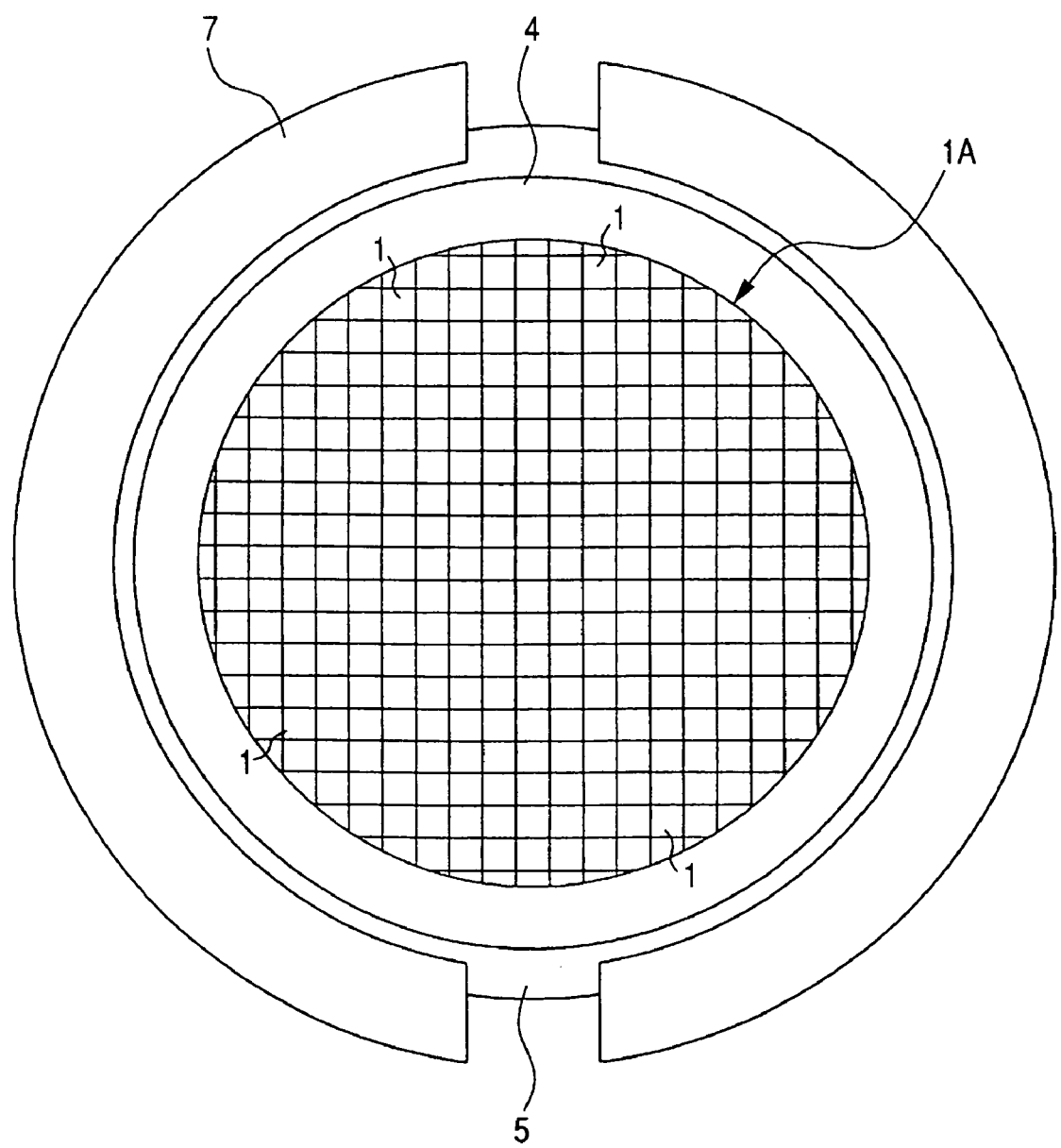
FIG. 5 is a plan view showing a state in which the semiconductor wafer and a dicing tape are fixed to a wafer ring, a pusher plate is arranged above the wafer ring, and an expanding ring is arranged below the wafer ring.
Figure 6:
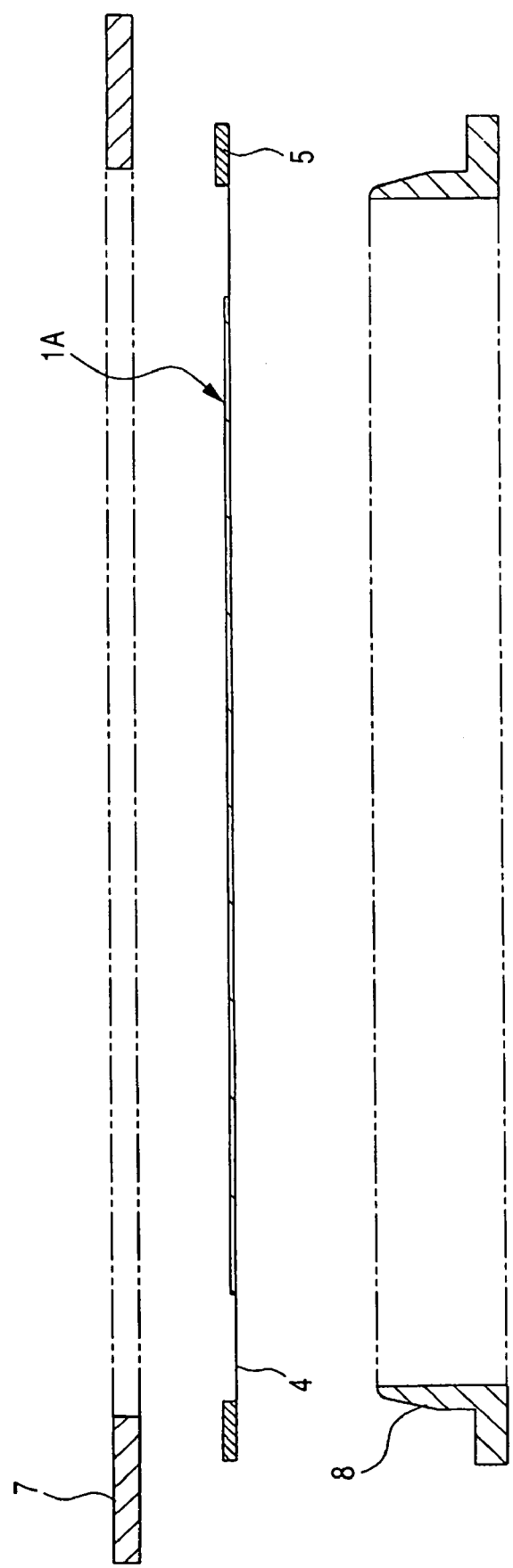
FIG. 6 is a cross-sectional view showing a state in which the semiconductor wafer and a dicing tape are fixed to a wafer ring, a pusher plate is arranged above the wafer ring, and an expanding ring is arranged below the wafer ring.
Figure 7:
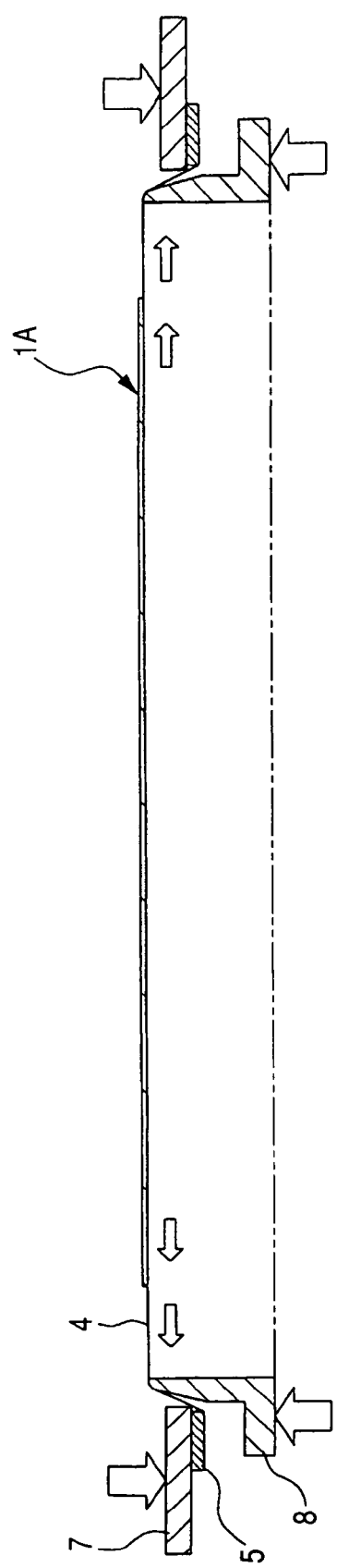
FIG. 7 is a cross-sectional view showing a state in which a tension is applied to the dicing tape by sandwiching the dicing tape between the wafer ring and the expending ring.

Next, as shown in FIG. 5 (a plan view) and FIG. 6 (a cross-sectional view), a pusher plate 7 is arranged above the dicing tape 4, which is fixed to the wafer ring 5, and an expander ring 8 is arranged below the dicing tape 4. Then, as shown in FIG. 7, the pusher plate 7 is pushed toward an upper surface of the wafer ring 5, and, at the same time, a peripheral portion of the back surface of the dicing tape 4 is pushed upwardly by the expander ring 8. Due to such a constitution, the dicing tape 4 receives a strong tension in the direction away from the center portion toward the peripheral portion thereof, so that the dicing tape 4 is stretched without being slackened.

Figure 8:
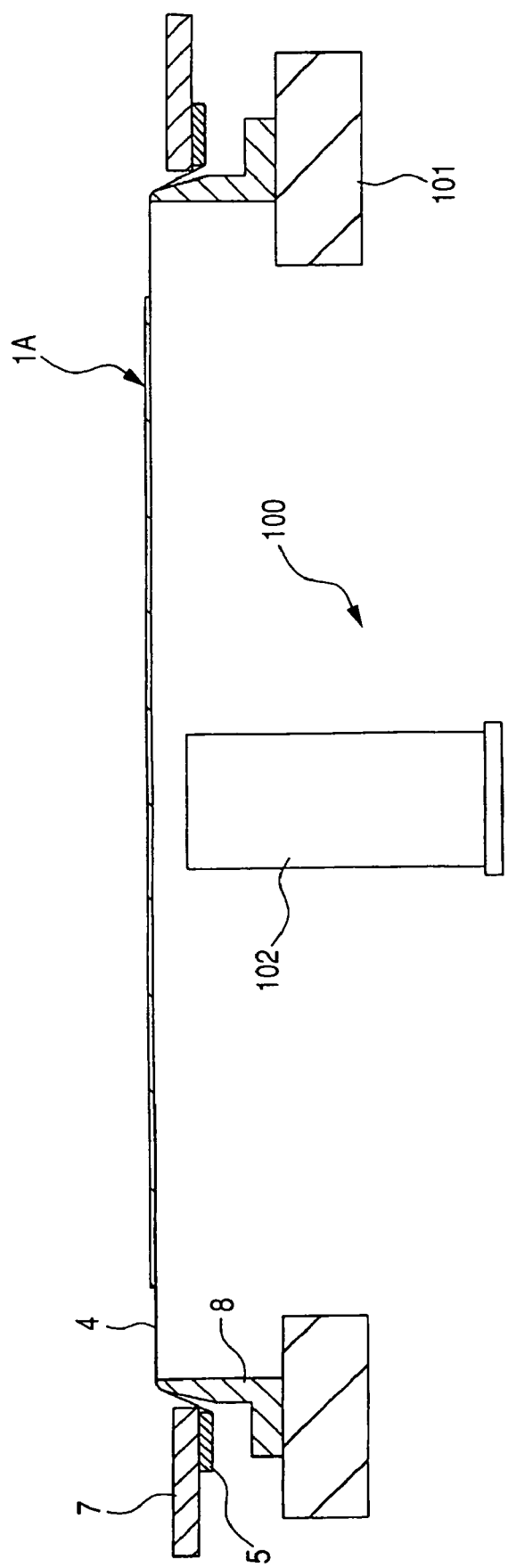
FIG. 8 is a cross-sectional view of part of a chip peeling-off device, illustrating a method of peeling the semiconductor chips off of a dicing tape to which the chips are laminated.

Next, in such a state, the expander ring 8 is positioned above a stage 101 of a chip peeling device 100, as shown in FIG. 8, and is held horizontally. At the center of the stage 101, a suction block 102 is arranged, which is movable in the horizontal direction, as well as in the vertical direction, using a driving mechanism (not shown in the drawing). The dicing tape 4 is held such that a back surface thereof faces an upper surface of the suction block 102 in an opposed manner.

Figure 9:
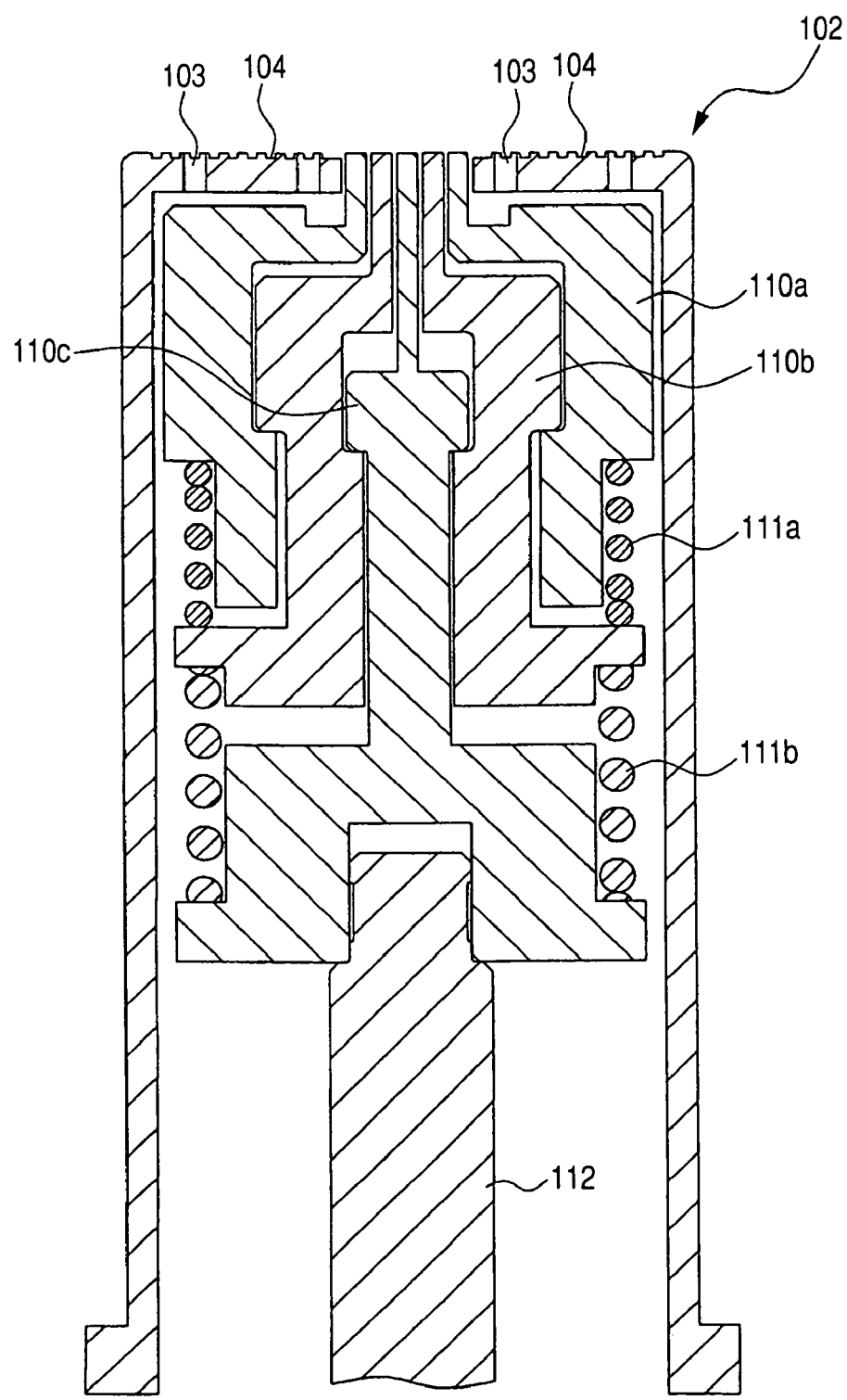
FIG. 9 is a cross-sectional view showing a suction block of a chip peeling-off device.
Figure 10:
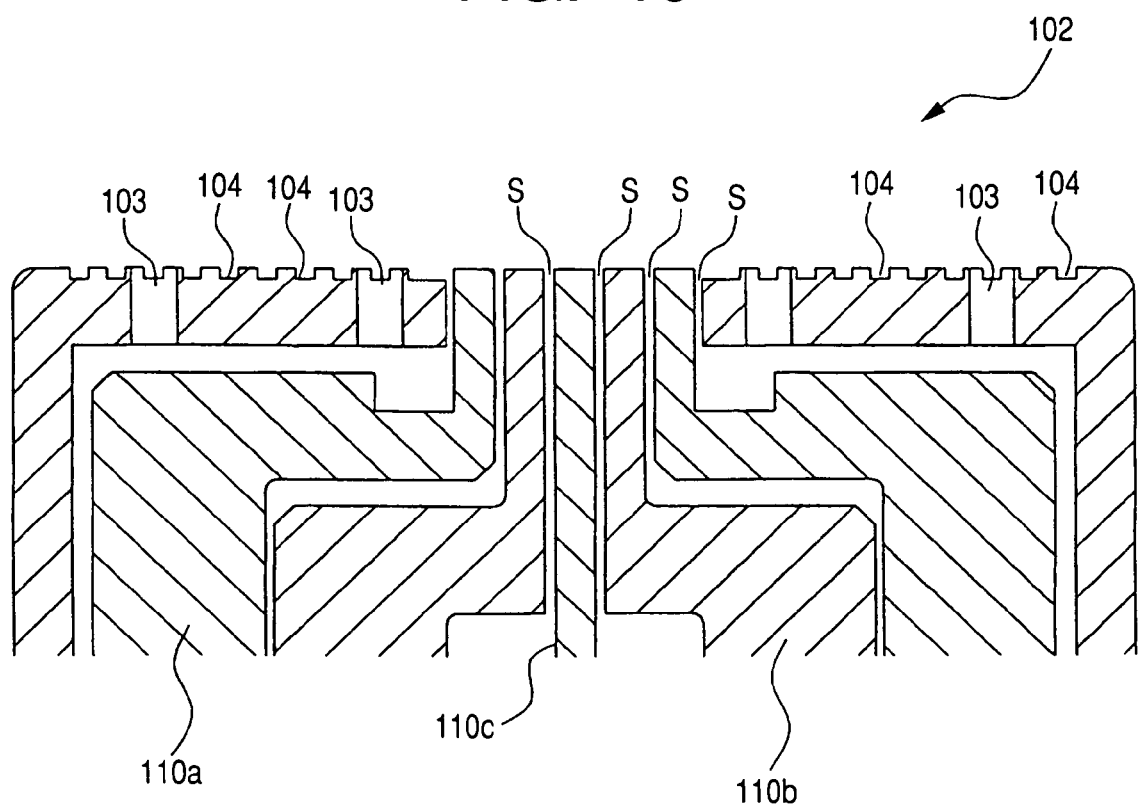
FIG. 10 is an enlarged cross-sectional view of the vicinity of an upper surface of the suction block.
Figure 11:
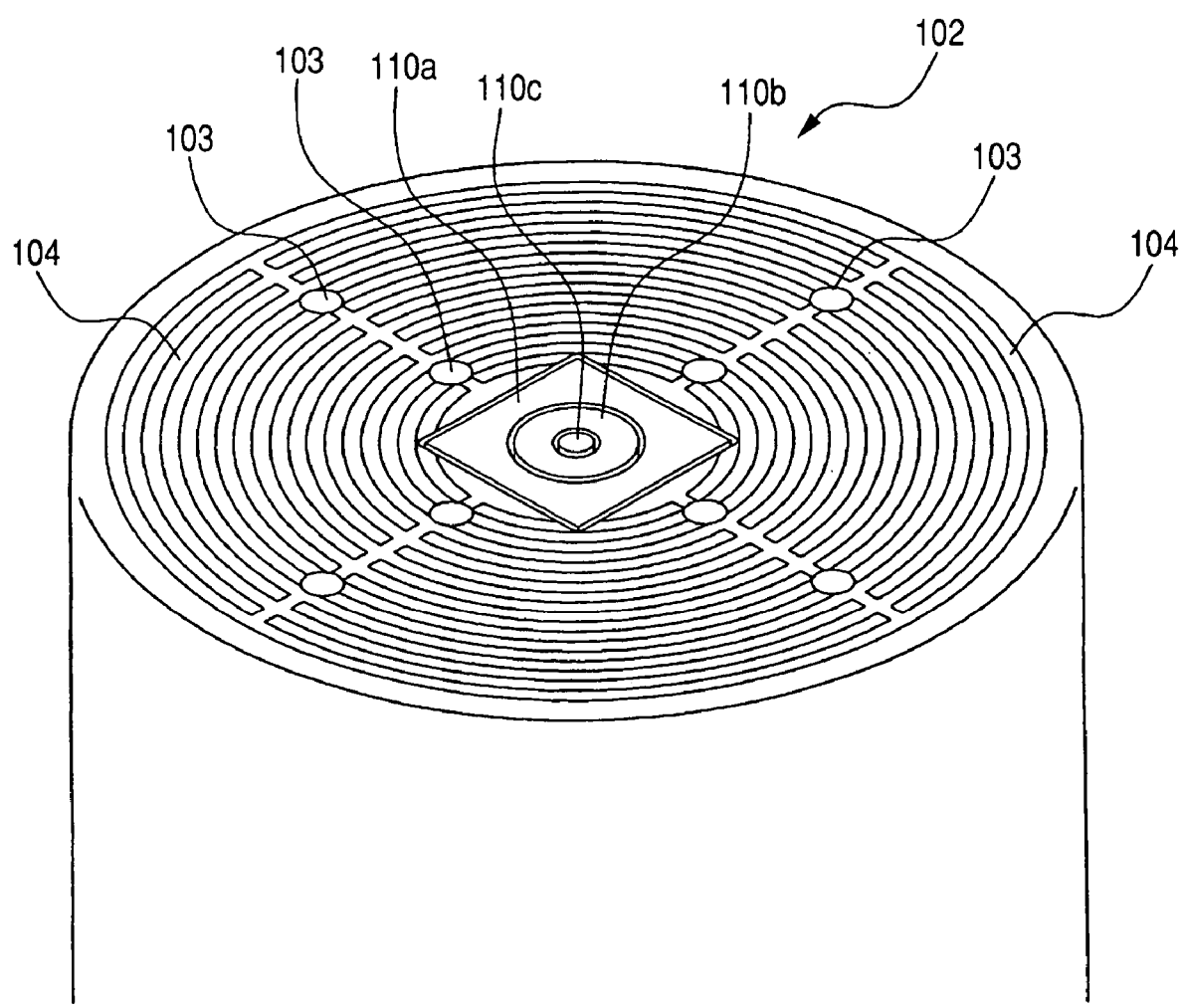
FIG. 11 is an enlarged perspective view of the vicinity of an upper surface of the suction block.

FIG. 9 is a cross-sectional view of a suction block 102, FIG. 10 is an enlarged cross-sectional view of the vicinity of an upper surface of the suction block 102, and FIG. 11 is an enlarged perspective view of the vicinity of an upper surface of the suction block 102.

In a peripheral portion of the upper surface of the suction block 102, there are a plurality of suction ports 103 and a plurality of concentrically formed grooves 104. The respective pressures inside the suction ports 103 and the grooves 104 are reduced by a suction mechanism (not shown in the drawing) when the suction block 102 is elevated and the upper surface thereof is brought into contact with a back surface of the dicing tape 4. In this way, the back surface of the dicing tape 4 is sucked downwardly and is carried to closely adhere to the upper surface of the suction block 102.

In sucking the dicing tape 4 downwardly, when the width and the depth of the above-mentioned grooves 104 are large, there is a possibility that the interface between neighboring chips 1 and the dicing tape 4 below the chips 1 will be peeled off in upper regions of the grooves 104 when the dicing tape 4, which is arranged below a chip next to the chip 1 which represents an object to be peeled off, is sucked to the groove 104. Particularly, the dicing tape 4 which uses a pressure sensitive adhesive having a relatively weak tackiness is liable to generate such peeling. When such a phenomenon occurs, during an operation to peel off the chips 1 which constitute objects to be peeled off from the dicing tape 4, there is a possibility that neighboring chips 1 will be removed from the dicing tape 4, and, hence, the phenomenon is not favorable. Accordingly, to prevent the occurrence of such a phenomenon, it is effective to prevent the formation of the gap between the dicing tape 4 below the neighboring chips and the upper surface of the suction block 102 as much as possible by making the width and the depth of the above-mentioned groove 104 as small as possible.

In a center portion of the suction block 102, three blocks 110a to 110c, which are used to push the dicing tape 4 upwardly, are incorporated. With respect to the three blocks 110a to 110c, inside of the first block 110a having the largest diameter, the second block 110b having a diameter smaller than the largest diameter is arranged. Further, inside of the second block 110b, the third block 110c having the smallest diameter is arranged. As will be explained later, the three blocks 110a to 110c are configured to be moved vertically in an interlocking manner under control of a first compression coil spring 111a, which is interposed between the outer block 110a and the intermediate block 110b, a second compression coil spring 111b, which is interposed between the intermediate block 110b and the inner block 110c and has a spring constant larger than a spring constant of the first compression spring 111a, and a pusher 112, which is connected with the inner block 110c and is vertically moved in response to a drive mechanism (not shown in the drawing).

Among the above-mentioned three blocks 110a to 110c, as the outer block 110a having the largest diameter, it is preferable to use a block having a diameter slightly smaller (for example, approximately 0.5 mm to 3 mm) than the diameter of the chip which represents an object to be peeled. For example, when the chip 1 has a square shape, it is preferable that the outer block 110a has a square shape slightly smaller than the square shape of the chip 1. Further, as will be explained later in conjunction with other embodiments, when the chip 1 has a rectangular shape, it is preferable that the outer block 110a has a rectangular shape slightly smaller than the rectangular shape of the chip 1. Due to such a constitution, corner portions which define an outer periphery of the upper surface of the block 110a are positioned slightly inside the outer peripheral edge of the chip 1, and, hence, it is possible to concentrate a force to peel off the chip 1 from the dicing tape 4 at a position (an outermost peripheral portion of the chip 1) which becomes a starting point at the time of peeling off the chip 1 from the dicing tape 4.

Further, it is desirable that the upper surface of the block 110a is a flat surface or a surface having a large radius of curvature to ensure a good contact area with the dicing tape 4. When the contact area between the upper surface of the block 110a and the dicing tape 4 is small, a large bending stress is focused on a peripheral portion of the chip 1, which is supported from below by the upper surface of the block 110a, and, hence, there is a possibility that the peripheral portion of the chip 1 will crack.

The intermediate block 110b, which is arranged inside the above-mentioned block 110a, has a diameter approximately 1 mm to 3 mm smaller than the diameter of the block 110a. Further, the block 110c having the smallest diameter, which is arranged inside the block 110b, has a diameter of approximately 1 mm to 3 mm, which is smaller than the diameter of the intermediate block 110b. In this embodiment, in consideration of the easiness of forming these blocks, the respective shapes of the intermediate block 110b and the inner block 110c have a circular columnar shape. However, these blocks 110b, 110c may also have the same quadrangular columnar shape or a shape similar to a quadrangular columnar shape in the same manner as the outer block 110a. The heights of the respective upper surfaces of three blocks 110a to 110c are equal to each other in an initial state (the blocks 110a to 110c being in a non-operative state), and they are also equal to the height of a peripheral portion of an upper surface of the suction block 102.

As shown in FIG. 10 in an enlarged manner, between the peripheral portion of the suction block 102 and the outer block 110a, as well as among three blocks 110a to 110c, gaps S are formed. The pressure inside these gaps (S) is reduced by a suction mechanism (not shown in the drawing), and, hence, when the back surface of the dicing tape 4 is brought into contact with the upper surface of the suction block 102, the dicing tape 4 is sucked downwardly and is brought into close contact with the upper surface of the blocks 110a to 110c.

Figure 12:
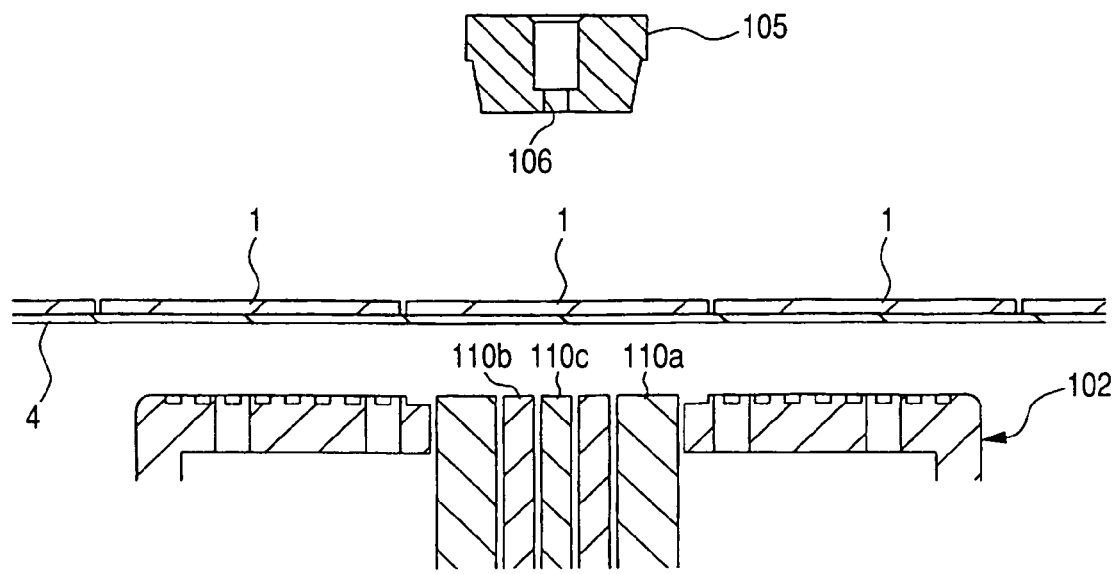
FIG. 12 is an enlarged cross-sectional view of the vicinity of an upper surface of the suction block, illustrating a method of peeling the semiconductor chips.

To peel off the chips 1 from the dicing tape 4 using the chip peeling device 100 having the above-mentioned suction block 102, first of all, as shown in FIG. 12, the center portion (blocks 110a to 110c) of the suction block 102 is moved to a position right below one chip 1, which represents the object to be peeled (the chip 1 positioned at the center portion in the drawing), and, at the same time, a suction collet 105 is moved to a position above the chip 1. In a center portion of a bottom surface of the suction collet 105, which is supported on a moving mechanism (not shown in the drawing), there is a suction opening 106 connected to a suction source, and, hence, the suction collet 105 is capable of selectively sucking and holding only one chip 1 which represents the object to be peeled.

Figure 13:
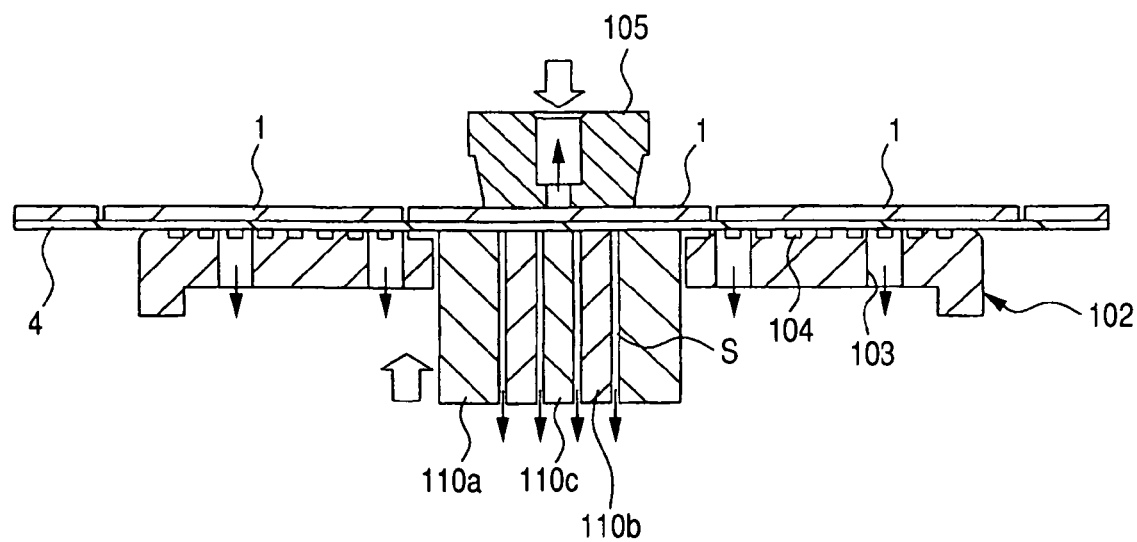
FIG. 13 is an enlarged cross-sectional view of the vicinity of an upper surface of the suction block, illustrating a method of peeling the semiconductor chips.

Next, as shown in FIG. 13, the suction block 102 is elevated to bring the upper surface thereof into contact with the back surface of the dicing tape 4, and, at the same time, the pressure inside the above-mentioned suction port 103, the grooves 104 and the gaps (S) is reduced. Accordingly, the dicing tape 4, which is in contact with the chip 1, is brought into close contact with the upper surface of the blocks 110a to 110c. Further, the dicing tape 4, which is also in contact with the other chips located adjacent to the chip 1, is brought into close contact with the peripheral portion of the upper surface of the suction block 102. Here, at this point in time, by pushing up the suction block 102 slightly (for example, approximately 400 μm), it is possible to apply a further tension to the dicing tape 4 to which a tension in the horizontal direction has already been applied by the above-mentioned pusher plate 7 and the expand ring 8, and, hence, it is possible to bring the suction block 102 and the dicing tape 4 into closer contact with each other in a more reliable manner.

Further, simultaneously with the elevation of the suction block 102, the suction collet 105 is lowered so as to bring the bottom surface of the suction collet 105 into contact with the upper surface of the chip 1, and, hence, the chip 1 is sucked by the suction collet 105, and, at the same time, the chip 1 is lightly pushed downwardly by the suction collet 105. In this manner, by sucking the chip 1 upwardly using the suction collet 105 at the time of sucking the dicing tape 4 using the suction block 102, it is possible to facilitate the peeling-off of the dicing tape 4 from the chip 1, which will be effected by pushing-up the blocks 110a to 110c.

Figure 14:
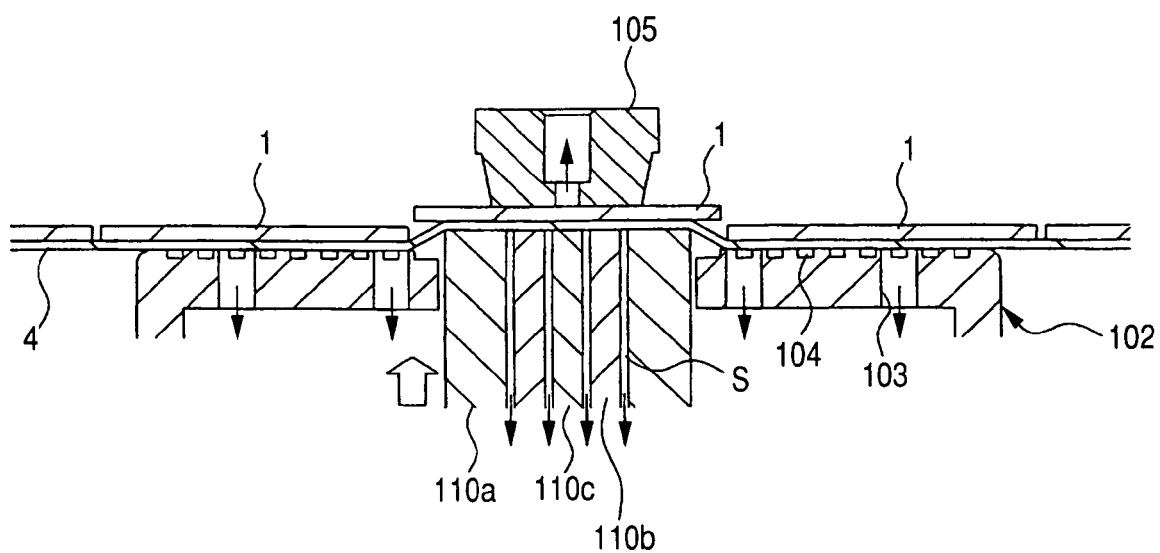
FIG. 14 is an enlarged cross-sectional view of the vicinity of an upper surface of the suction block, illustrating a method of peeling the semiconductor chips.
Figure 15:
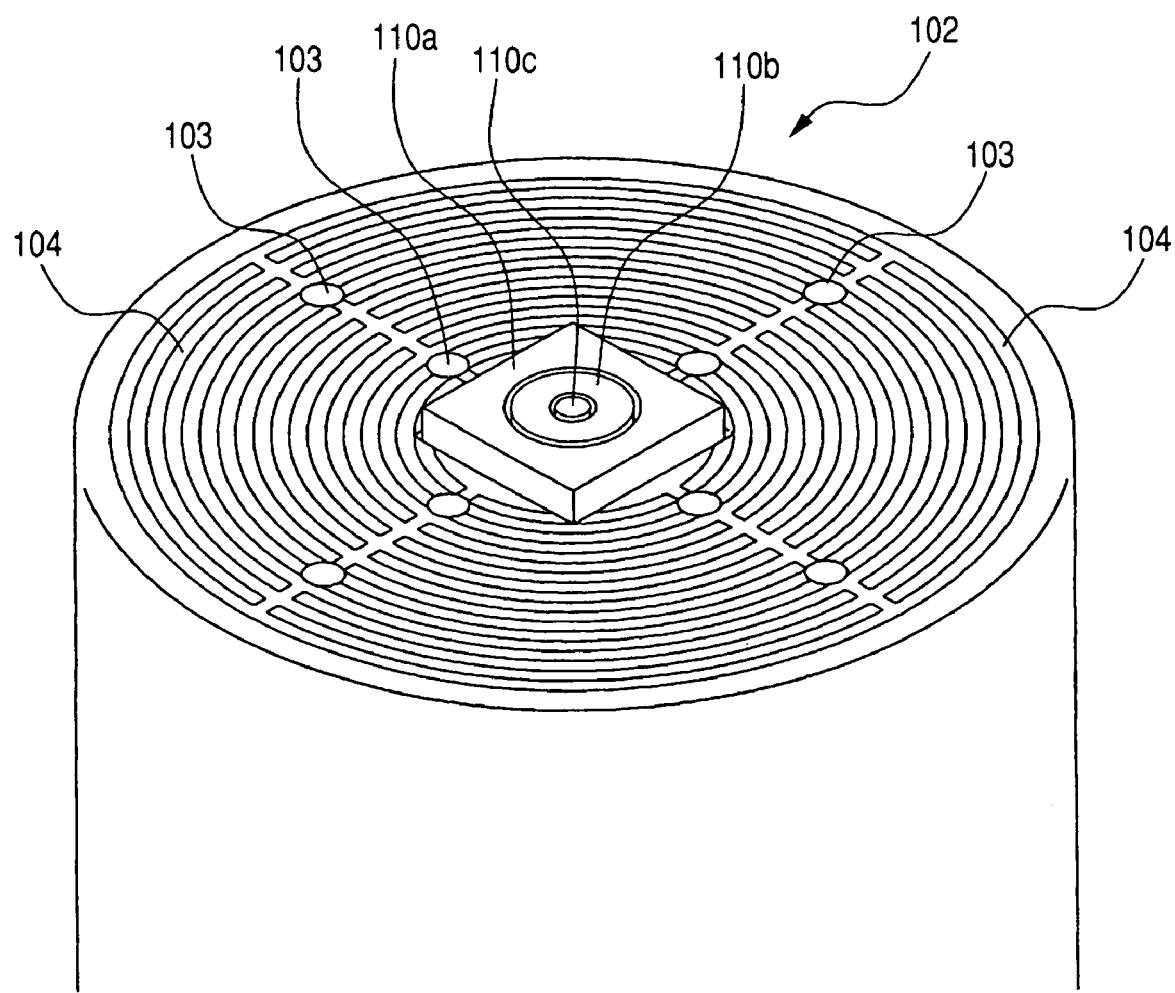
FIG. 15 is an enlarged perspective view of the vicinity of an upper surface of the suction block, for illustrating a method of peeling the semiconductor chips.

Next, as shown in FIG. 14, the three blocks 110a to 110c are simultaneously pushed upward so as to apply an upwardly-directed load to the back surface of the dicing tape 4, thus pushing up the chip 1 and the dicing tape 4. Further, at this point in time, the back surface of the chip 1 is supported on the upper surfaces (contact surfaces) of the blocks 110a to 110c by way of the dicing tape 4, and, hence, the bending stress applied to the chip 1 will be minimized. At the same time, by arranging the outer periphery (corner portions) of the upper surface of the block 110a inside the outer periphery of the chip 1, it is possible to focus the peeling stress onto the interface which represents a peeling-off starting point of the chip 1 and the dicing tape 4, and, hence, it is possible to efficiently peel off the peripheral portion of the chip 1 from the dicing tape 4. Here, by sucking the dicing tape 4 below the neighboring chip downwardly, thus bringing the dicing tape 4 into close contact with the peripheral portion of the upper surface of the suction block 102, it is possible to enhance the peeling-off of the dicing tape 4 in the peripheral portion of the chip 1. FIG. 15 is an enlarged perspective view showing the vicinity of the upper surface of the suction block 102 (illustration of the chip 1 and the dicing tape 4 has been omitted from the drawing).

Although the upward movement (stroke) of the above-mentioned blocks 110a to 110c is approximately 0.7 mm, for example, it is preferable to increase or decrease the amount of this movement in response to the size of the chip 1. That is, when the chip 1 is large in size, the contact area between the chip 1 and the dicing tape 4 is large, and, hence, the adhesive strength between them is also large, whereby it is necessary to increase the length of the upward stroke. On the other hand, when the size of the chip 1 is small, the contact area between the chip 1 and the dicing tape 4 is small, and, hence, the adhesive strength between them is also small, whereby they are easily peeled off from each other even when the of the upward stroke amount is reduced. Here, the pressure sensitive adhesive applied to the dicing tape 4 differs in tackiness depending on the manufacture and the type of adhesive. Accordingly, even when the size of the chip 1 is equal, when the dicing tape 4 uses a pressure sensitive adhesive having a large tackiness, it is necessary to increase the amount of the upward stroke.

Further, in applying a load to the back surface of the chip 1 by pushing the blocks 110a to 110c upwardly, in the outermost peripheral portion of the chip 1, it is preferable to set the bending stress in a direction perpendicular to the outer periphery of the chip so that it is smaller than the bending stress in a direction parallel to the outer periphery of the chip. On the outermost peripheral portion of the chip 1, minute cracks which are generated when the wafer 1A is diced using the above-mentioned dicing blade 6 remain. Accordingly, when a strong bending stress along a direction perpendicular to the outer periphery of the chip 1 is applied to the outermost peripheral portion of the chip 1 at the time of pushing the blocks 110a to 110c upwardly, there arises a possibility that the cracks will grow and that the chip 1 will crack. In this embodiment, using the block 110a having an upper surface which is slightly smaller than the size of the chip 1, a uniform load is applied to the portion of the chip 1 slightly inside the outermost peripheral portion of the chip 1, and, hence, it is possible to uniformly peel off the whole peripheral portion of the chip 1 from the dicing tape 4 while obviating the above-mentioned drawbacks.

Figure 16:
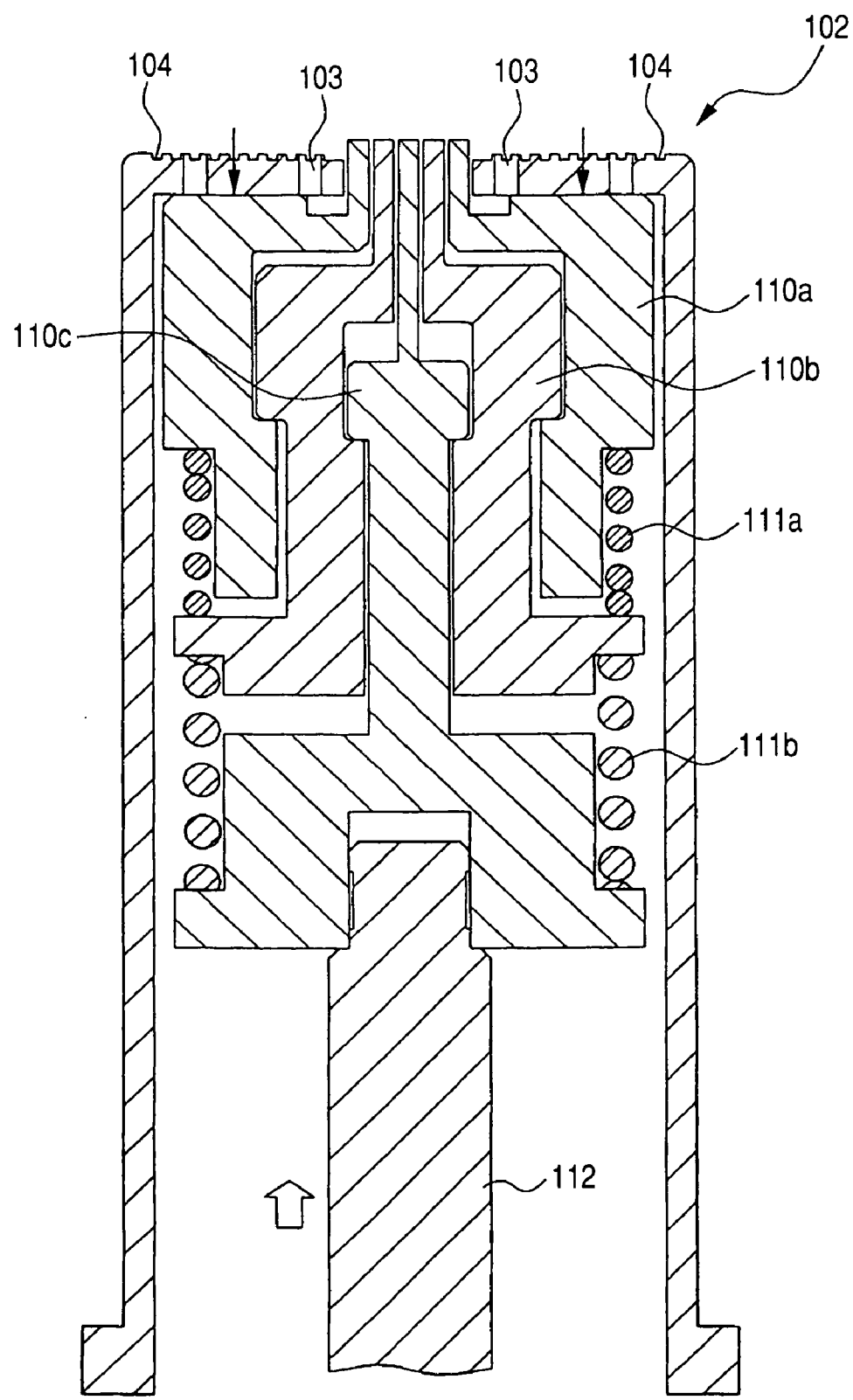
FIG. 16 is a cross-sectional view of the suction block.

To simultaneously push three blocks 110a to 110c upwardly, as shown in FIG. 16, the pusher 112 is pushed upwardly so as to push up the inner block 110c, which is connected to the pusher 112. Accordingly, due to a spring force of the compression coil spring 111b, which is interposed between the inner block 110c and the intermediate block 110b, the intermediate block 110b is pushed up. Further, due to the spring force of the compression coil spring 111a, which is interposed between the outer block 110a and the intermediate block 110b, the outer block 110a is pushed up. Accordingly, the three blocks 110a to 110c are simultaneously pushed up. Then, a portion (a surface indicated by arrows in the drawing) of the outer block 110a is brought into contact with the inner peripheral portion of the suction block 102, whereby the upward movement of the blocks 110a to 110c is stopped. Here, most of the region of the chip 1, which represents the object to be peeled, is supported on the upper surfaces of the three blocks 110a to 110c, and, hence, the peeling at the interface between the chip 1 and the dicing tape 4 efficiently progresses in the region outside the outer periphery (corner portions) of the upper surface of the block 110a.

In simultaneously pushing the three blocks 110a to 110c upwardly, the pusher 112 pushes up the block 110c with a force sufficiently weak to prevent the contraction of the compression coil spring 111a having a weak spring force. Due to such a constitution, after a portion of the outer block 110a is brought into contact with the inner peripheral portion of the suction block 102, due to the forces provided by springs 111a and 111b, there is no possibility that the intermediate block 110b and the inner block 110c can be further pushed upwardly.

Further, the compression coil spring 111a is required to have a sufficient spring force that the compression coil spring 111a can lift the block 110a against at least the tension of the dicing tape 4. In the case where the spring force of the compression coil spring 111a is smaller than the tension of the dicing tape 4, even when the pusher 112 is pushed up, the outer block 110a is not lifted, and, hence, it is difficult to support the chip 1 with the upper surface of the outer block 110a in the manner shows in FIG. 14. In this case, since it is impossible to concentrate sufficient stress on the peeling start point of the chip 1 and the dicing tape 4, there arises a possibility that drawbacks will arise, such as the lowering of the peeling speed or the occurrence of cracks in the chip 1 due to the application of an excessively large bending stress to the chip 1.

Figure 17:
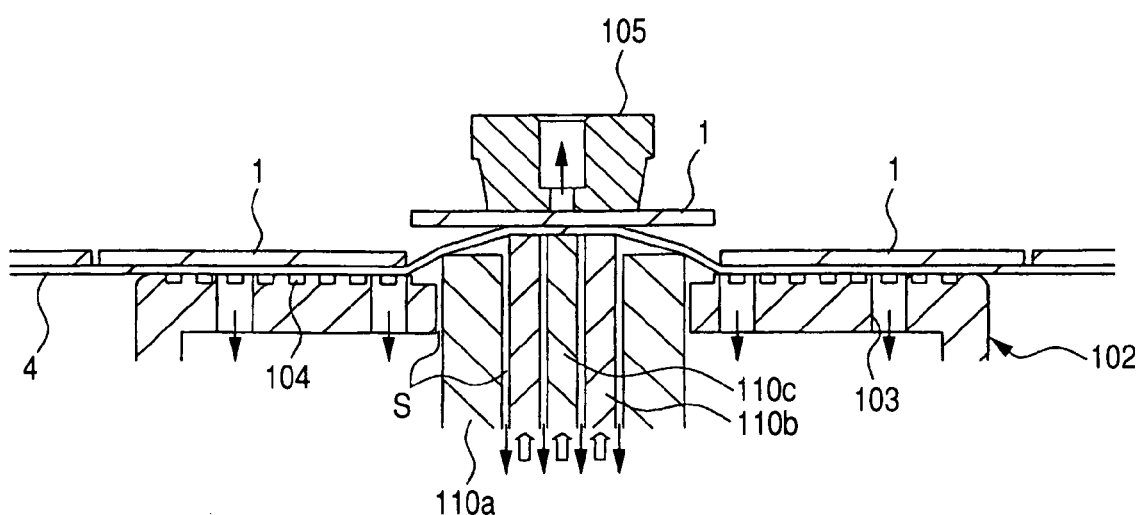
FIG. 17 is an enlarged cross-sectional view of the vicinity of an upper surface of the suction block.
Figure 18:
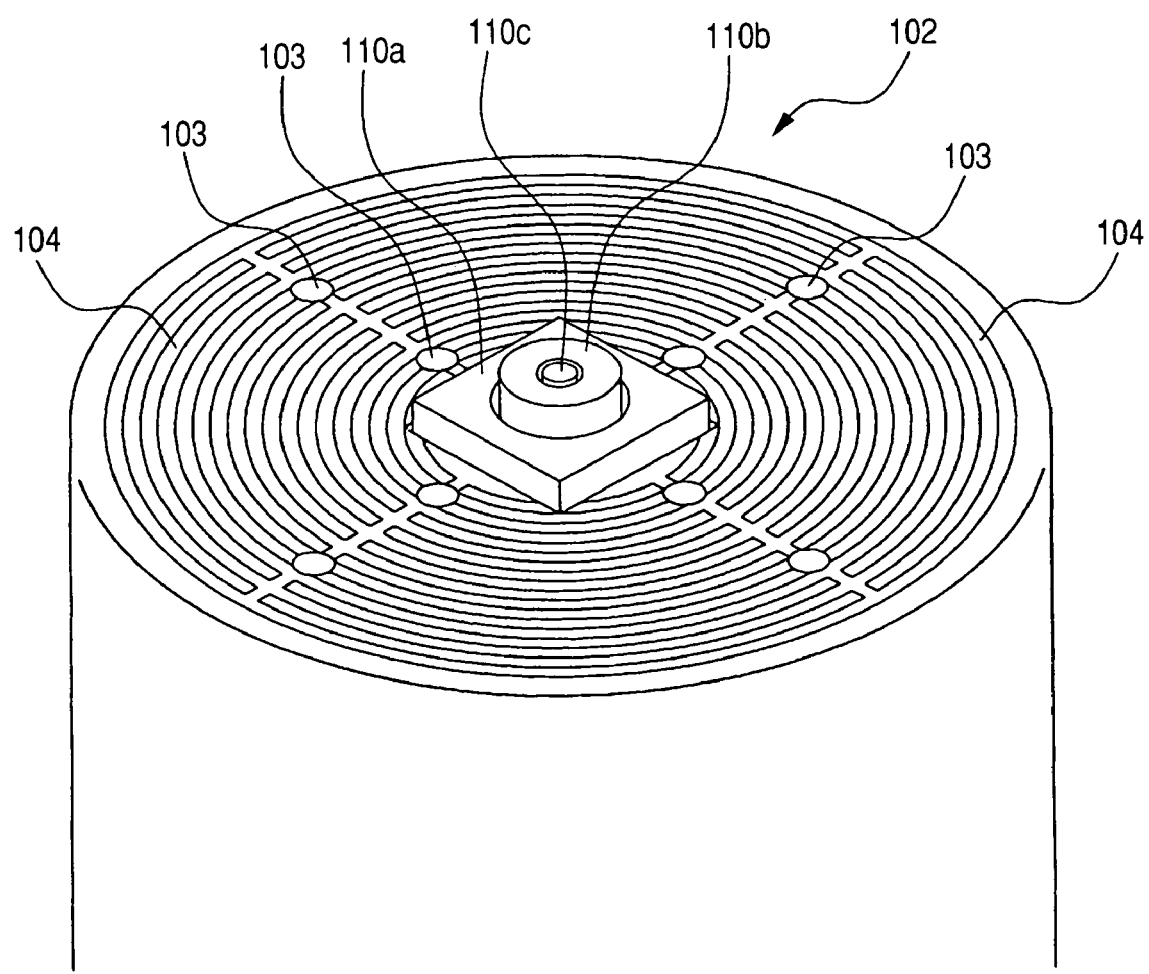
FIG. 18 is an enlarged perspective view of the vicinity of an upper surface of the suction block.

Next, as shown in FIG. 17, the dicing tape 4 is pushed up even further by simultaneously pushing the intermediate block 110b and the inner block 110c. Due to such a constitution, the position of the outer periphery (corner portions) of the upper surface of the block 110b, which supports the chip 1, is shifted more inside compared to the state in which the chip 1 is supported on the block 110a, and, hence, the peeling-off of the chip 1 and the dicing tape 4 advances in the direction toward the center of the chip 1 from the region outside the outer periphery of the upper surface of the block 110b. FIG. 18 is an enlarged perspective view showing the vicinity of the upper surface of the suction block 2 at this point in time (the illustration of the chip 1 and the dicing tape 4 being omitted).

Figure 19:
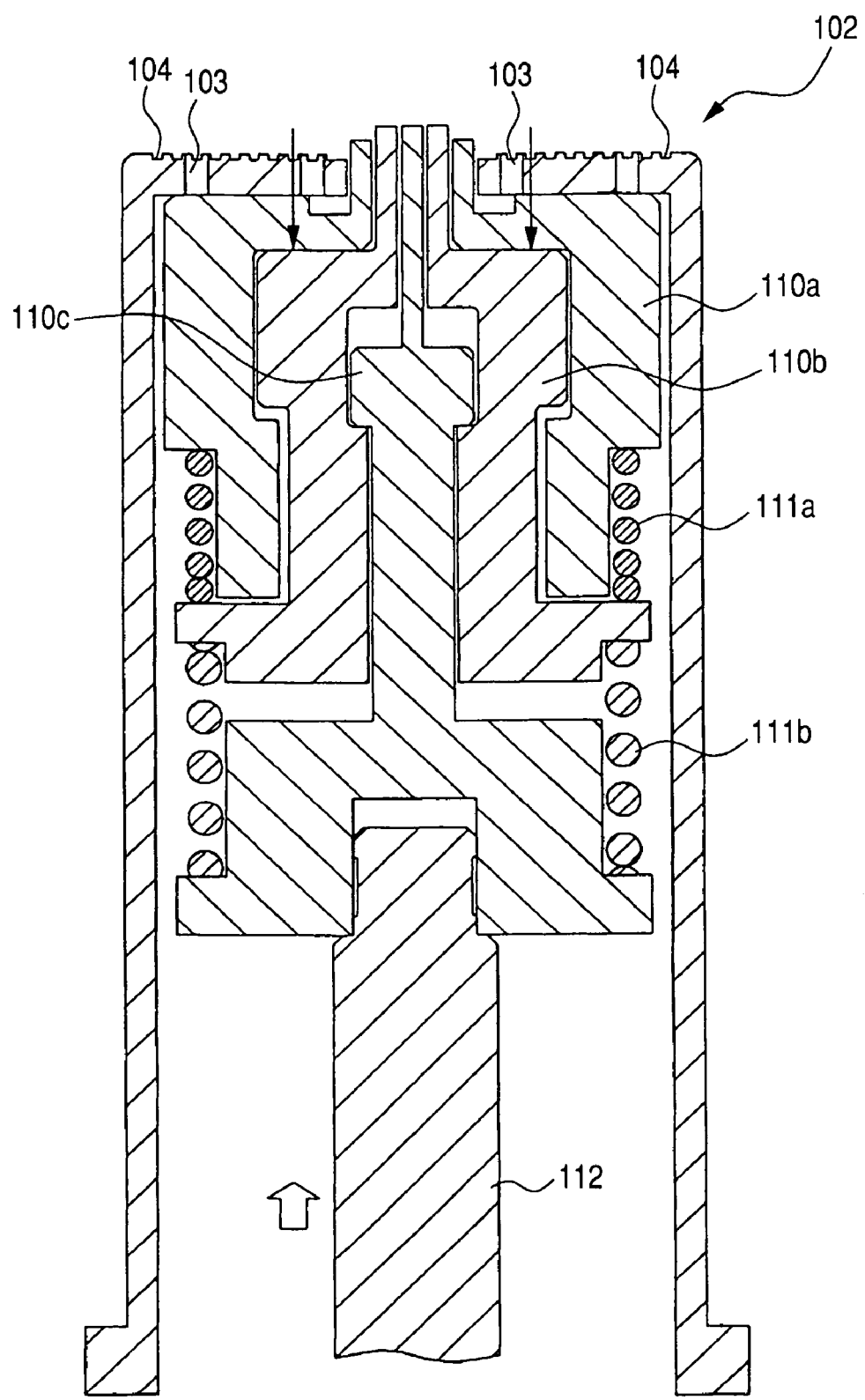
FIG. 19 is a cross-sectional view of the suction block.

To push the two blocks 110b, 110c upwardly simultaneously, as shown in FIG. 19, by pushing up the pusher 112, the block 110c which is connected to the pusher 112 is further pushed up. Here, since the intermediate block 110b is pushed up by the spring force of the compression coil spring 111b, the two blocks 110b, 110c are simultaneously pushed up. Then, at a point in time at which a portion (a surface indicated by arrows in the drawing) of the intermediate block 110b is brought into contact with the outer block 110a, the upward movement of the blocks 110b, 110c is stopped. Further, the force with which the pusher 112 pushes up the block 110c is set to a value which can cause the compression coil spring 111a, which has a weak spring force to contract, but does not cause the compression coil spring 111b, which has a strong spring force, to contract. Accordingly, after the portion of the intermediate block 110b is brought into contact with the outer block 110a, there is still a possibility that the inner block 110c can be further pushed up.

In pushing the two blocks 110b, 110c upwardly, to facilitate the peeling-off of the chip 1 and the dicing tape 4, the dicing tape 4, which is in contact with the chip 1, is sucked downwardly by reducing the pressure inside the gaps (S) of the blocks 110a to 110c. Further, the pressure inside the grooves 104 is reduced so as to bring the dicing tape 4, which is in contact with the peripheral portion of the upper portion of the suction block 102, into close contact with the upper surface of the suction block 102 (FIG. 17).

Figure 20:
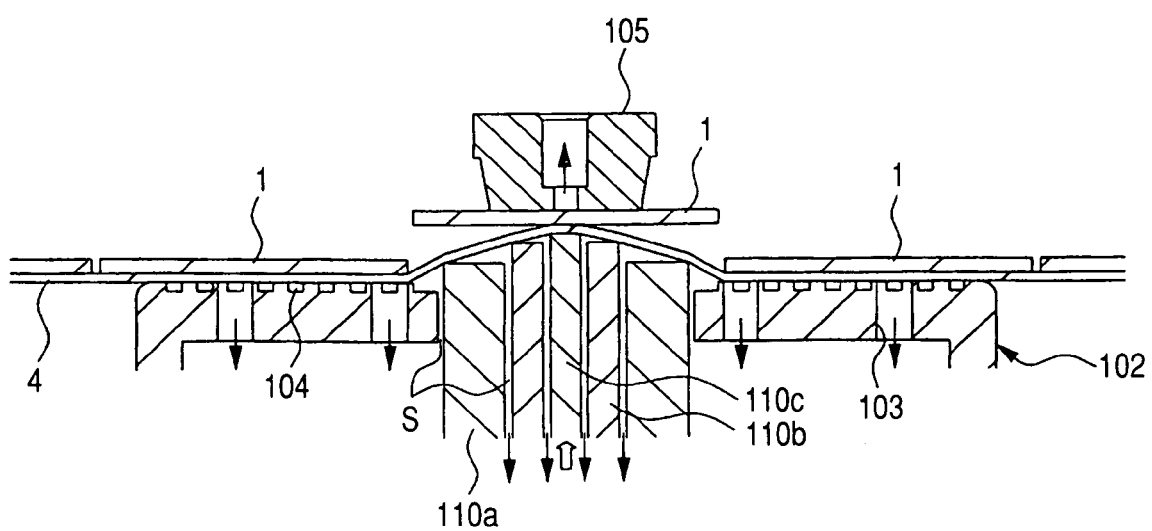
FIG. 20 is an enlarged cross-sectional view of the vicinity of an upper surface of the suction block.
Figure 21:
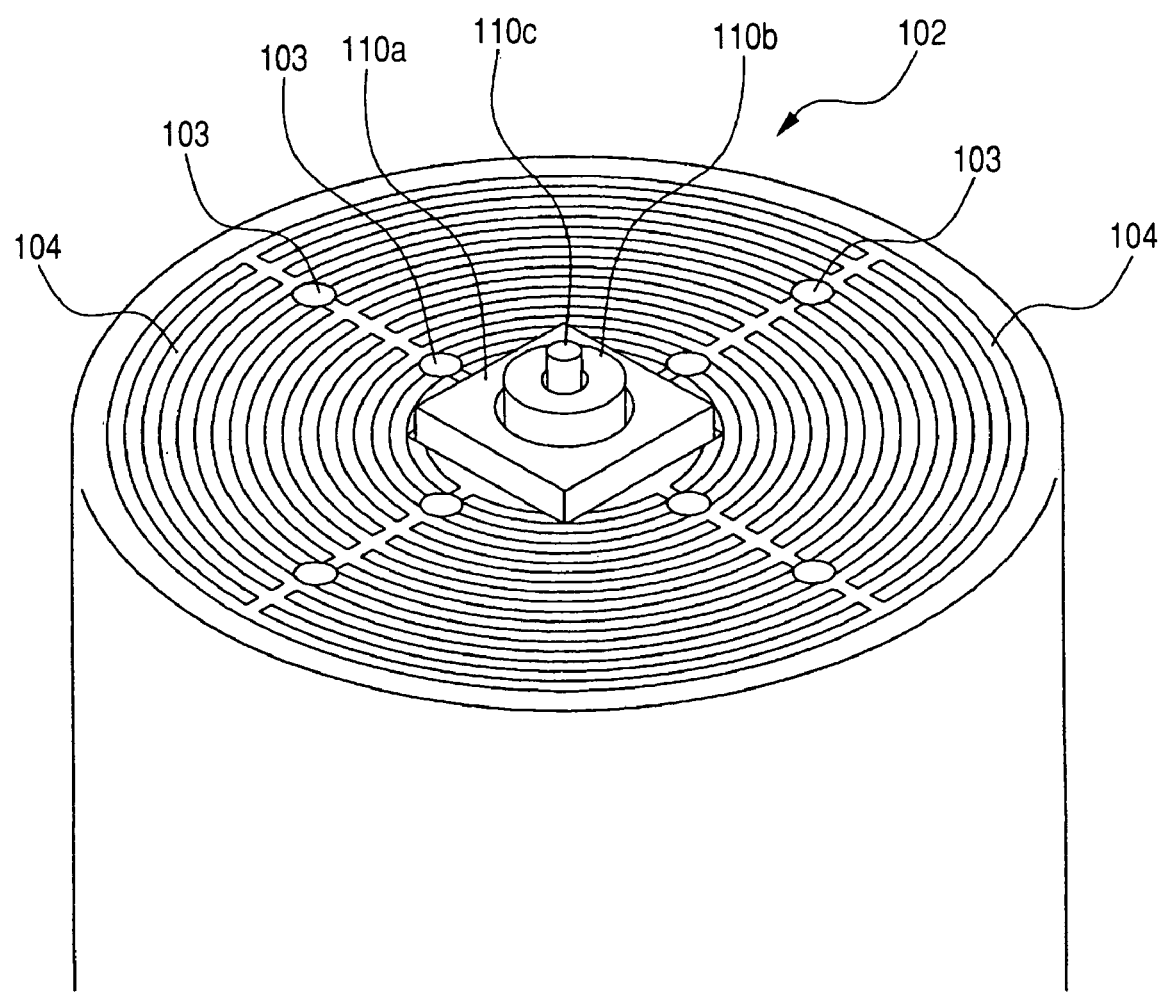
FIG. 21 is an enlarged perspective view of the vicinity of an upper surface of the suction block.
Figure 22:
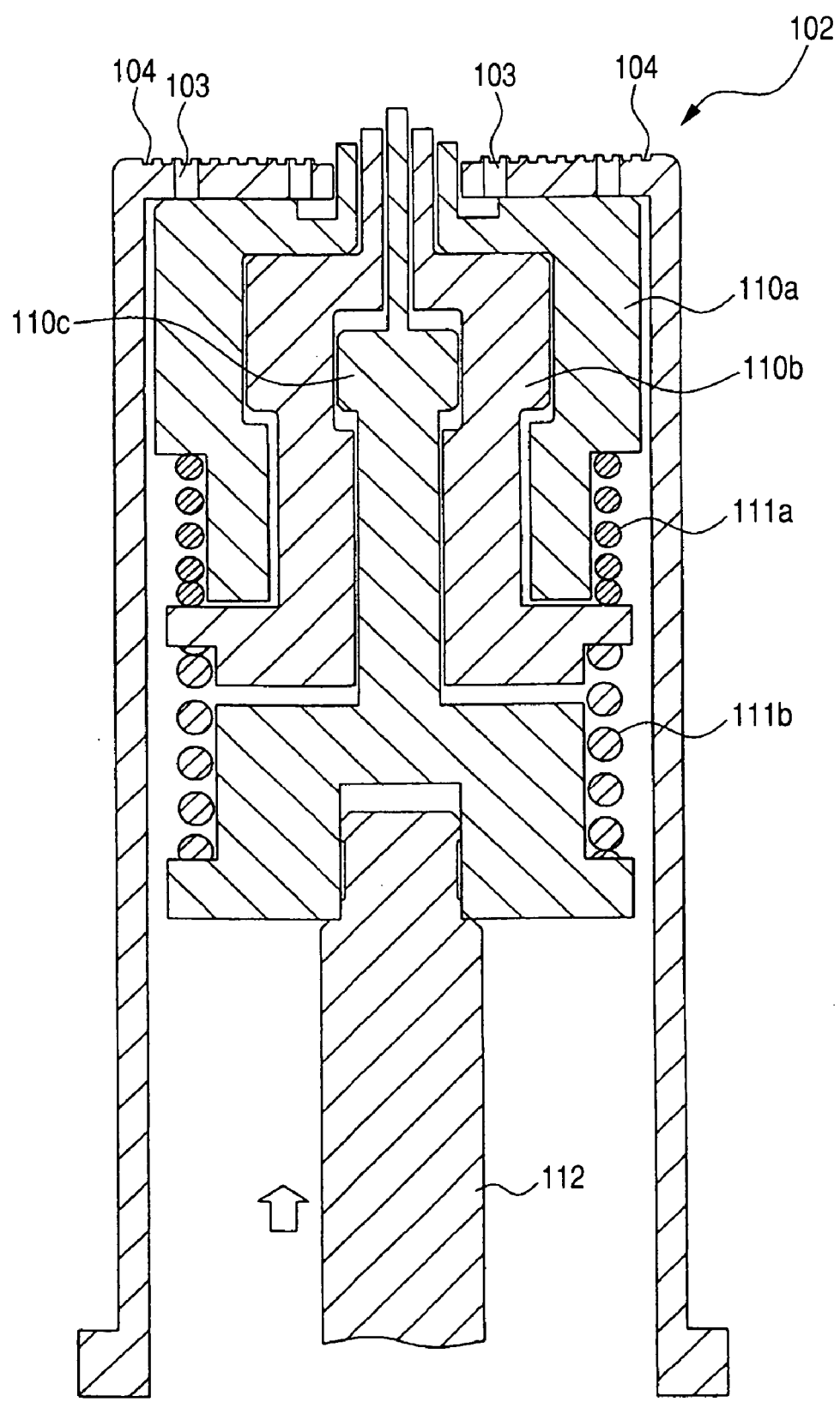
FIG. 22 is a cross-sectional view of the suction block.

Next, as shown in FIG. 20, the inner block 110c is further pushed upward to push up the back surface of the dicing tape 4 and to support the back surface of the chip 1 on the upper surface of the block 110c. FIG. 21 is an enlarged perspective view showing the vicinity of the upper surface of the suction block 102 at this point in time (the illustration of the chip 1 and the dicing tape 4 being omitted from the drawing). To push the inner block 110c upwardly, as shown in FIG. 22, the block 110c is pushed up with a force sufficiently strong to contract the compression coil spring 111b. Accordingly, the peeling-off of the chip 1 and the dicing tape 4 progresses in the region outside the outer periphery (corner portions) of the upper surface of the block 110c, which is in contact with the dicing tape 4.

Figure 23:
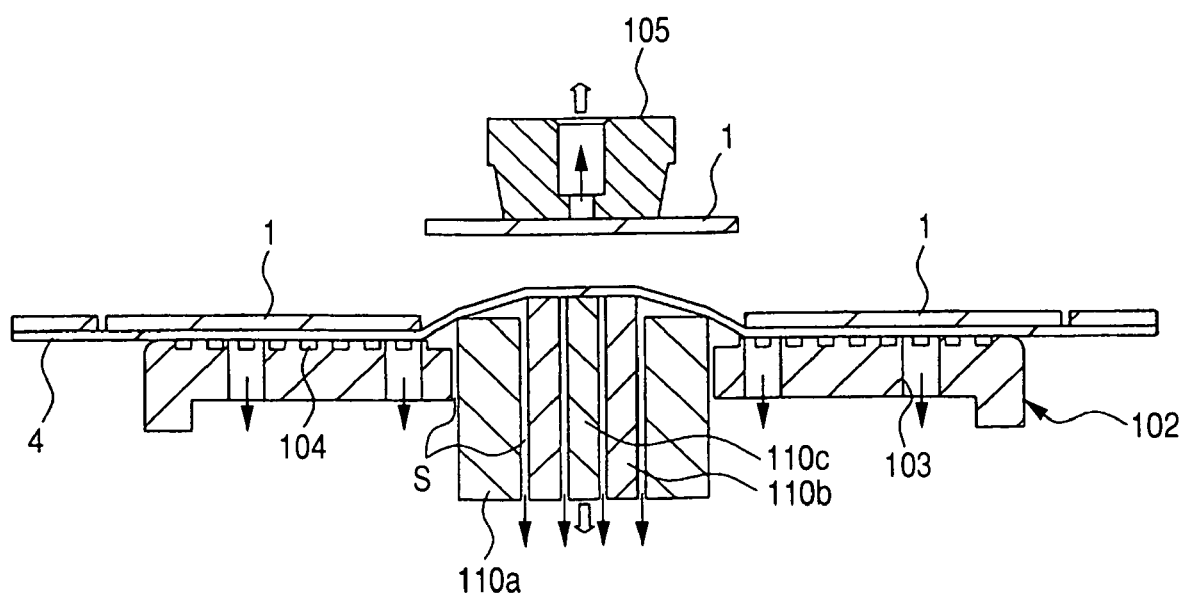
FIG. 23 is an enlarged cross-sectional view of the vicinity of an upper surface of the suction block.

Subsequently, as shown in FIG. 23, the block 110c is pulled downwardly, and, at the same time, the suction collet 105 is pulled upwardly, thus completing the operation to peel off the chip 1 from the dicing tape 4.

It is necessary to decrease the area of the upper surface of the block 110c to an extent that the chip 1 can be peeled off from the dicing tape 4 merely with the suction force of the suction collet 105 when the block 110c is pushed upwardly. When the area of the upper surface of the block 110c is large, the contact area between the chip 1 and the dicing tape 4 becomes large, and, hence, the tackiness of both components is increased, whereby it is impossible to peel off the chip 1 from the dicing tape 4 with only the force with which the suction collet 105 sucks the chip 1.

On the other hand, in case the area of the upper surface of the block 110c is decreased, when the block 110c pushes up the back surface of the dicing tape 4, a strong load is applied in a concentrated manner to the narrow region (the center portion) of the chip 1, and, hence, the chip 1 may crack in an extreme case. Accordingly, in pushing up the block 110c, it is desirable that the push-up speed is lowered, the time that the upper surface of the block 110c is in contact with the dicing tape 4 is shortened, or the extent of the push-up stroke of the block 110c is decreased (for example, to approximately 0.2 mm to 0.4 mm), so as to prevent a strong load from being applied to the narrow region of the chip 1.

Further, as one method of increasing the suction force of the suction collet 105, it is effective to reduce the pull-up speed of the suction collet 105. When the suction collet 105 is rapidly pulled up in a state in while a portion of the chip 1 is brought into close contact with the dicing tape 4, a gap is generated between the bottom surface of the suction collet 105 and the upper surface of the chip 1, and, hence, the degree of vacuum in the inside of the suction collet 105 is lowered, whereby the force which sucks the chip 1 is lowered. On the other hand, when the pull-up speed of the suction collet 105 is reduced, the time necessary for peeling off the chip 1 from the dicing tape 4 is prolonged. Accordingly, it is preferable to set the pull-up speed of the suction collet 105 so that it is variable, such that the pull-up speed is reduced at the time of starting of the pull-up operation to ensure a sufficient suction force, while the pull-up speed is increased when the contact area between the chip 1 and the dicing tape 4 is decreased to a certain level to prevent a delay of the peeling time. Further, to set the area of the bottom surface of the suction collet 105 so that it is larger than the area of the upper surface of the block 110c is also an effective method for increasing the suction force of the suction collet 105.

In this manner, by increasing the suction force of the suction collet 105, even when the contact area between the chip 1 and the dicing tape 4 is relatively large, it becomes possible to peel off the chip 1 from the dicing tape 4 by using merely the suction force of the suction collet 105; and, hence, the peeling time can be shortened, and, at same time, the above-mentioned drawbacks which are generated when the area of the upper surface of the block 110c is made small can be obviated.

Further, when the block 110c is pulled downwardly in a state in which the chip 1 is being pushed downwardly by the suction collet 105, the suction collet 105 is also moved downwardly, and, hence, there is a possibility that the chip 1 will be brought into contact with the block 110c and crack. Accordingly, in pulling the block 110c downwardly, it is preferable that the suction collet 105 is pulled up immediately before the above-mentioned pull-downward operation or the position of block 110c is fixed at least to prevent the downward movement of the suction collet 105.

The chip 1 which is peeled off from the dicing tape 4 is transported to the next step (pellet bonding step), while being sucked and held by the suction collet 105. Further, when the suction collet 105 which has transported the chip 1 to the next step returns to the chip peeling device 100, the next chip 1 is peeled off from the dicing tape 4 in accordance with the steps shown in FIG. 12 to FIG. 23. Hereinafter, the chips 1 are peeled off one after another from the dicing tape 4 in accordance with similar steps.

As shown in FIG. 24, the chip 1 which is transported to the pellet bonding step is mounted on the printed circuit wiring board 11 by way of an adhesive 10 or the like, and it is electrically connected with an electrode 13 of the printed circuit wiring board 11 by way of an Au wire 12.

Next, as shown in FIG. 25, a second chip 14 is stacked on the chip 1, which is mounted on the printed circuit wiring board 11 by way of the adhesive 10 or the like and is electrically connected with an electrode 16 of the printed wiring board 11 by way of an Au wire 15. The second chip 14 is a silicon chip which has an integrated circuit mounted thereon that is different from the integrated circuit mounted on the chip 1. The second chip 14 is peeled off from the dicing tape 4 using the above-mentioned method, and, thereafter, it is transported to the pellet bonding step and is stacked on the chip 1.

Figure 26:
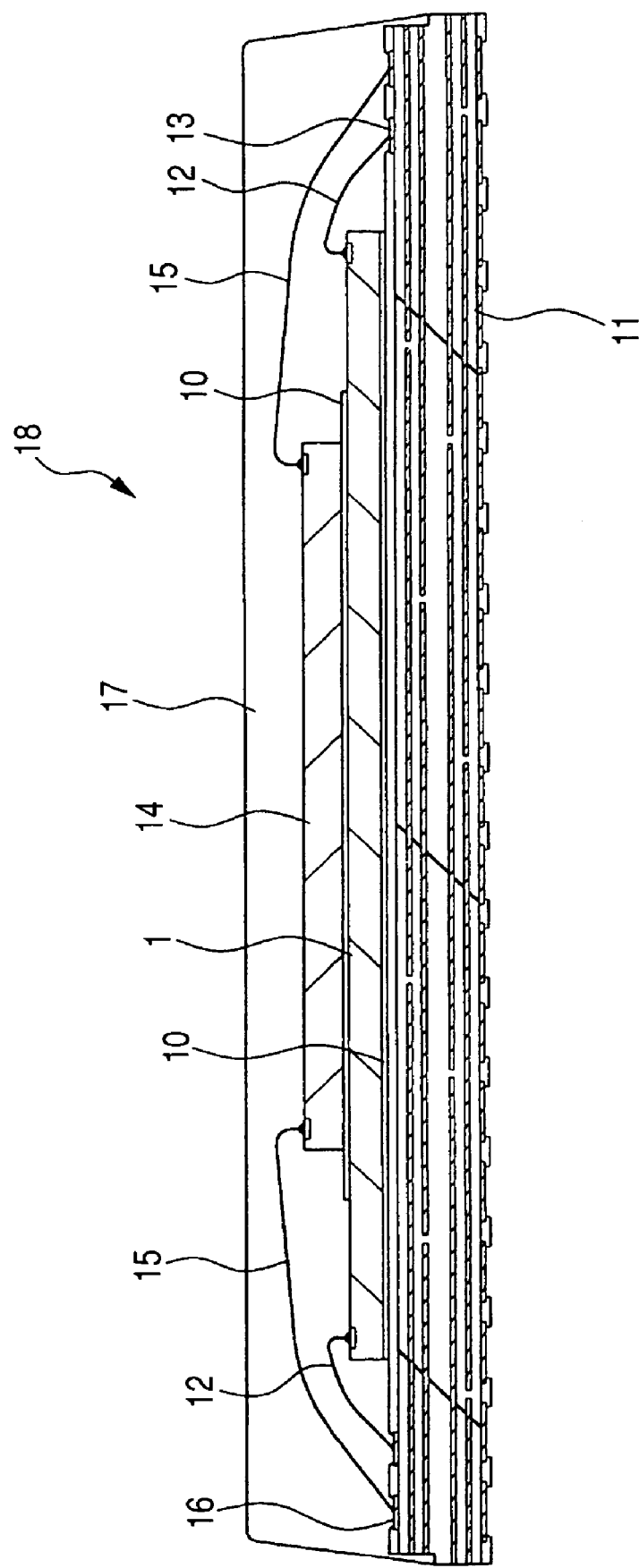
FIG. 26 is a cross-sectional view of a printed circuit wiring board showing a step of resin sealing of the semiconductor chips.

Thereafter, the printing wiring board 11 is transported to the molding step, and, as shown in FIG. 26, the chips 1, 14 are sealed by a mold resin 17, thus completing a stacked package 18.

Figure 27A:
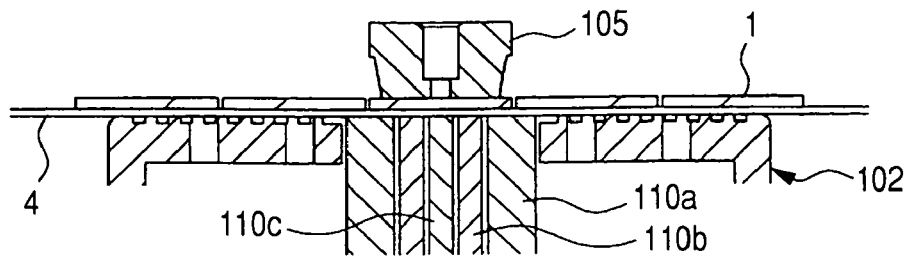
FIG. 27(a) to FIG. 27(c) are cross-sectional views of the vicinity of an upper surface of a suction block, illustrating another example of a method of peeling the semiconductor chips.
Figure 27B:
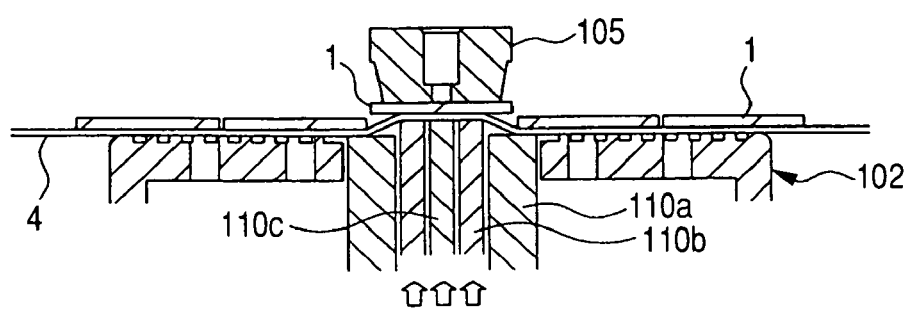
Figure 27C:
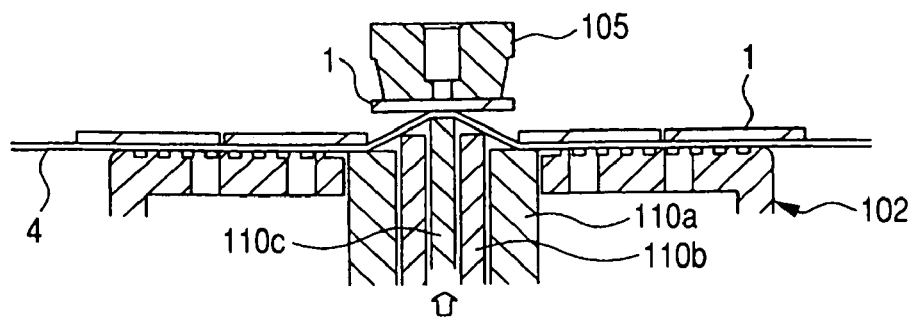

Here, in conjunction with this embodiment, an explanation has been made with respect to a case in which the chip 1, which represents the object to be peeled off, is made slightly larger than the outer block 110a. However, as shown in FIG. 27(a), for example, when the chip 1, which represents the object to be peeled off, is smaller than the outer block 110a and is larger than the intermediate block 110b, as shown in FIG. 27(b), first of all, the intermediate block 110b is pushed up to peel off the peripheral portion of the chip 1 from the dicing tape 4 and, thereafter, as shown in FIG. 27(c), the inner block 110c is pushed up to remove the center portion of the chip 1 from the dicing tape 4. In this case, a spacer is inserted between the suction block 102 and the outer block 110a, for example, so as to prevent the outer block 110a from being lifted even when the pusher 112 is pushed up.

Here, in conjunction with this embodiment, an explanation has been made with respect to a method which may be employed to peel off the chip using three blocks (110a to 110c), however, the number of blocks is not limited to three, and four or more blocks may be used when the size of the chip 1 which represents the object to be peeled off is large. Further, when chip 1 which represents the object to be peeled off is extremely small in size, two blocks may be used.

(Embodiment 2)

The above-mentioned embodiment 1 adopts a method in which, first of all, three blocks 110a to 110c are simultaneously pushed upwardly, and, thereafter, the intermediate block 110b and the inner block 110c are further pushed up, and, finally, the inner block 110c is further pushed upwardly so as to peel off the chip 1 from the dicing tape 4.

Figure 28:
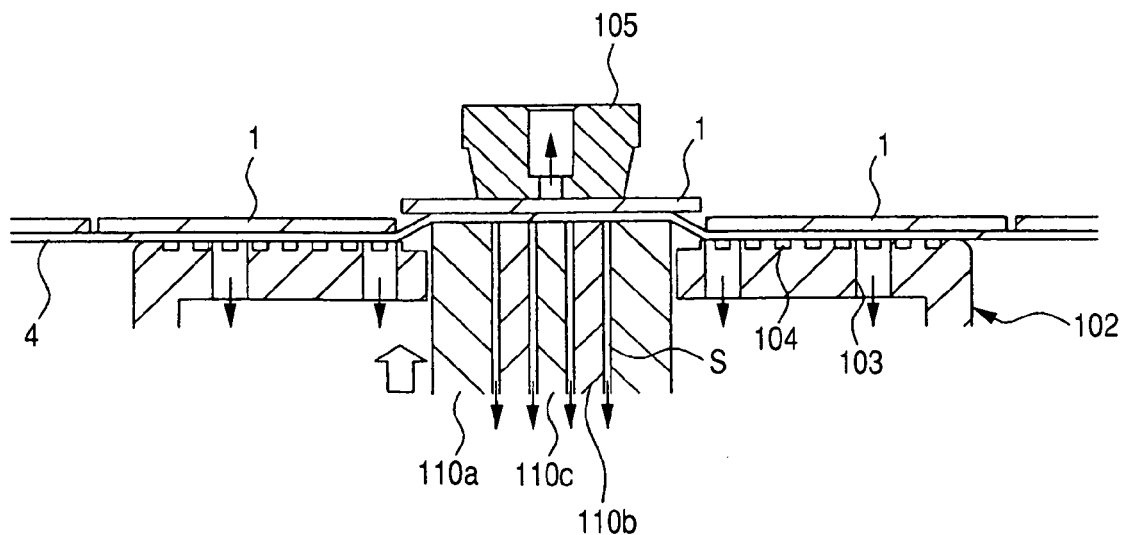
FIG. 28 is an enlarged cross-sectional view of the vicinity of an upper surface of a suction block.
Figure 29:
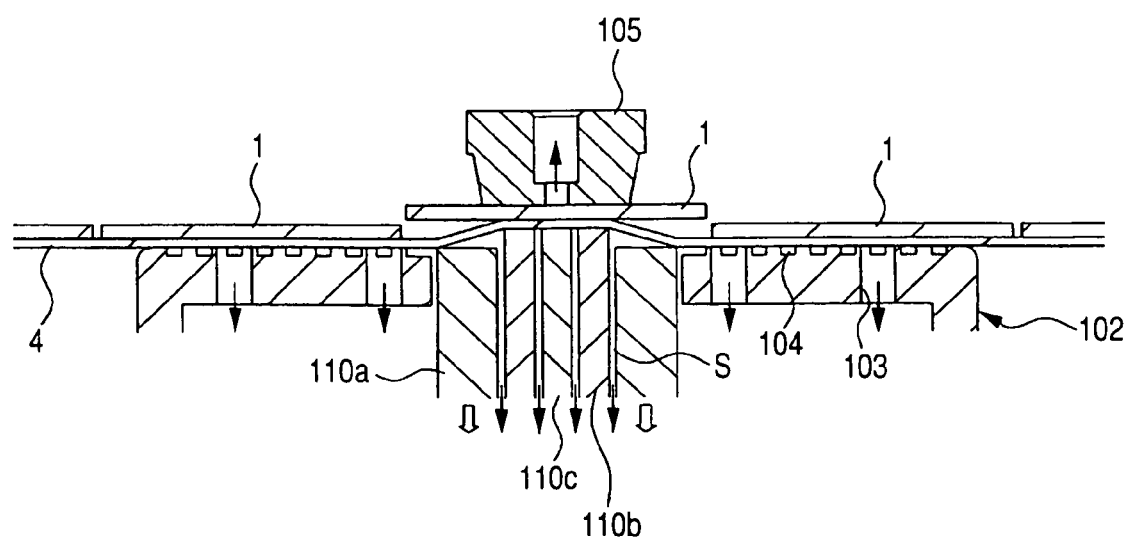
FIG. 29 is an enlarged cross-sectional view of the vicinity of an upper surface of a suction block, illustrating another example of a method of peeling the semiconductor chips.
Figure 30:
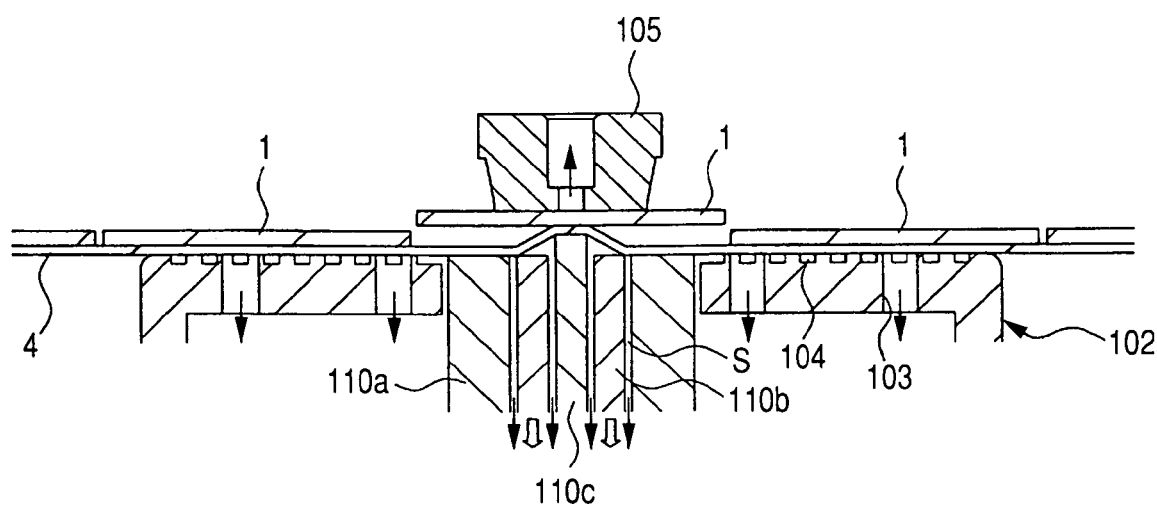
FIG. 30 is an enlarged cross-sectional view of the vicinity of an upper surface of a suction block, illustrating another example of a method of peeling the semiconductor chips.

On the contrary, as shown in FIG. 28, first of all, three blocks 110a to 110c are simultaneously pushed upwardly so as to uniformly peel off the whole peripheral portion of the chip 1 from the dicing tape 4, and, thereafter, as shown in FIG. 29, the outer block 110a is lowered to cause the peeling of the chip 1 from the dicing tape 4 to progress in a direction toward the center of the chip 1. Then, as a final step, as shown in FIG. 30, the intermediate block 110b is lowered to further cause the peeling of the chip 1 from the dicing tape 4 to progress in the direction toward the center of the chip 1, so as to completely peel off the chip 1 from the dicing tape 4.

Although the above-mentioned method can reduce the extent of the push-up stroke of the blocks 110a to 110c compared to the above-mentioned embodiment 1, the tension which the intermediate block 110b and the inner block 110c apply to the dicing tape 4 is decreased. Accordingly, for example, in the case in which the size of the chip 1 is large or the case in which the tackiness of the pressure sensitive adhesive applied to the dicing tape 4 is strong, when the tackiness of the chip 1 and the dicing tape 4 is relatively large compared to the force which sucks the dicing tape 4 downwardly using the suction block 102 or the force which the sucks the chip 1 upwardly using the suction collet 105, the peeling of the chip 1 becomes difficult.

Further, the above-mentioned method requires drive mechanisms which vertically move the three blocks 110a to 110c in plural systems, and, hence, the structure of the suction block 102 becomes complicated.

(Embodiment 3)

Figure 31:
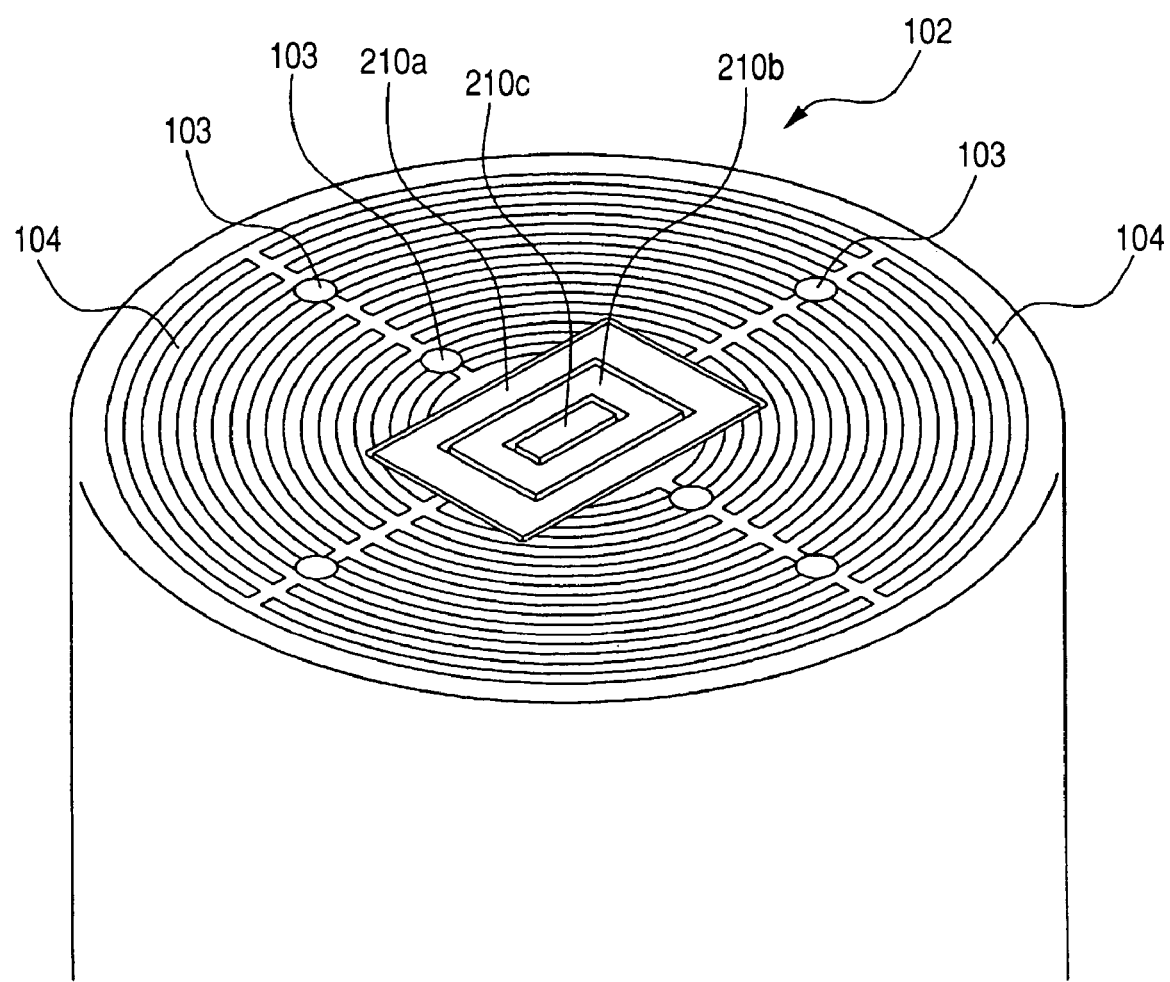
FIG. 31 is an enlarged perspective sectional view of the vicinity of an upper surface of a suction block according to another embodiment of the present invention.

The above-mentioned embodiment 1 has been directed to a case in which the chip 1 which represents the object to be peeled off has a square shape. However, to peel off a rectangular chip 1 having longitudinal and lateral lengths which differ from each other, for example, as shown in FIG. 31, three rectangular blocks 210a to 210c which differ in size are used. Due to such a constitution, it is possible to efficiently cause the peeling to progress by focusing the stress on the peeling start point of the chip 1 and the dicing tape 4, while reducing the bending stress applied to the chip 1. Here, as the outer block 210a having the largest diameter, it is preferable to use a block having a diameter slightly smaller than the chip 1 which represents the object to be peeled, thus preventing a strong load from being applied to the outermost portion of the chip 1.

Figure 32A:
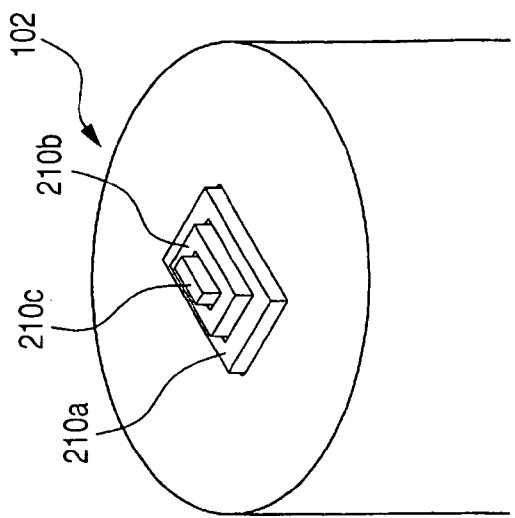
FIG. 32(a) to FIG. 32(c) are perspective views of the vicinity of an upper surface of a suction block, illustrating the method of peeling semiconductor chips using the suction block shown in FIG. 31.
Figure 32B:
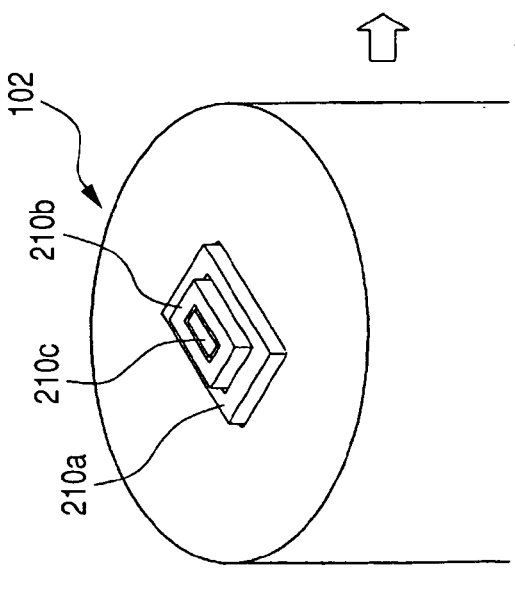
Figure 32C:
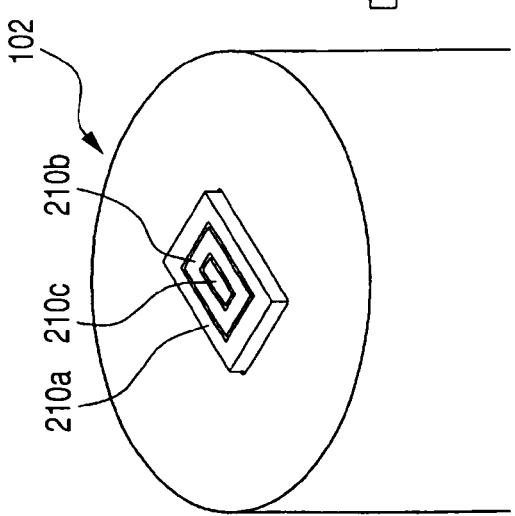

To peel off the chip 1 using the rectangular blocks 210a to 210c, first of all, as shown in FIG. 32(a), three blocks 210a to 210c are simultaneously pushed upward. Next, as shown in FIG. 32(b), the intermediate block 210b and the inner block 210c are further pushed upward. Finally, as shown in FIG. 32(c), the inner block 210C is further pushed upward. Alternatively, as described in conjunction with the embodiment 2, it is possible to adopt a method in which the three blocks 210a to 210c are simultaneously pushed upward, and, thereafter, the outer block 210a is lowered, followed by the intermediate block 210b being lowered.

Figure 33:
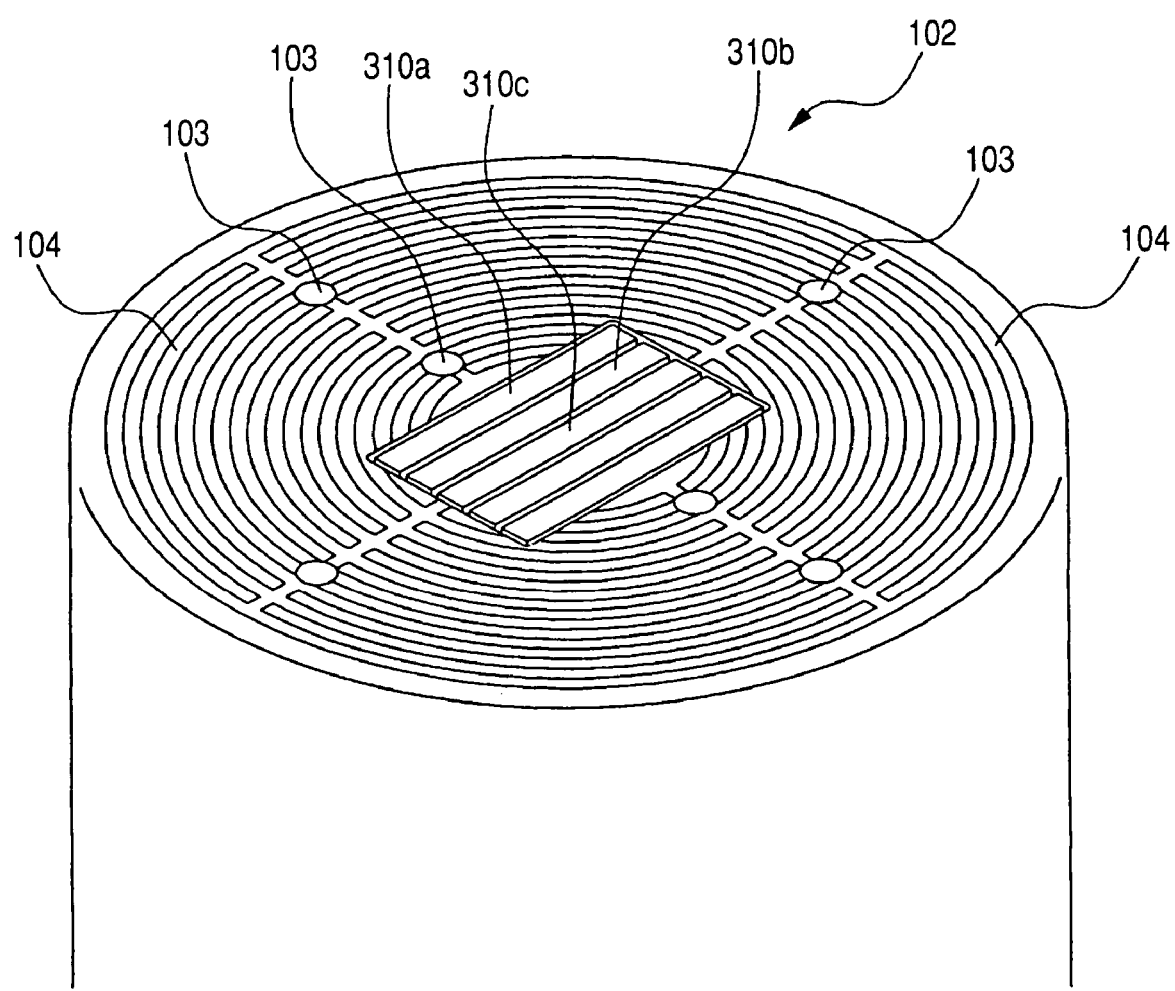
FIG. 33 is an enlarged perspective view of the vicinity of an upper surface of a suction block of another embodiment of the present invention.

FIG. 33 shows an example in which blocks 310a to 310c are constituted by arranging five rectangular blocks in parallel, wherein the center block constitutes the inner block 310c, two blocks arranged at both sides of the inner block 310c constitute intermediate blocks 310b, and the two outermost blocks constitute outer blocks 310a.

Figure 34A:
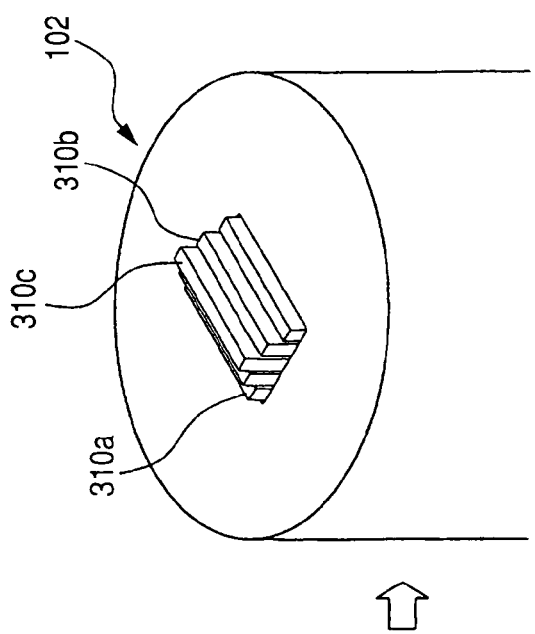
FIG. 34(a) to FIG. 34(c) are perspective views of the vicinity of an upper surface of a suction block, illustrating the method of peeling semiconductor chips using the suction block shown in FIG. 33.
Figure 34B:
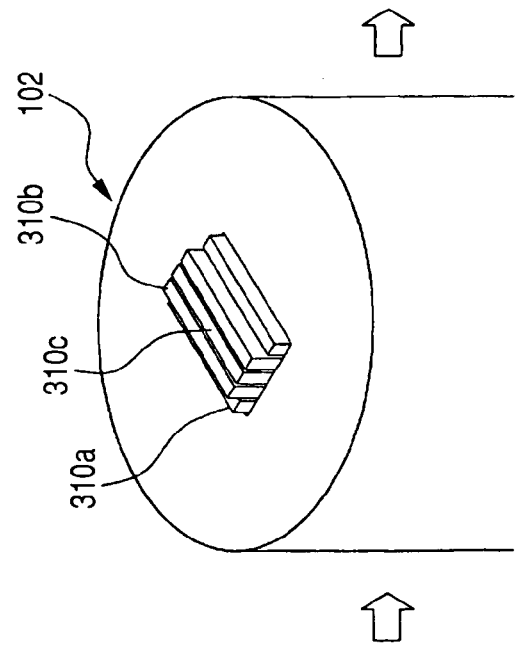
Figure 34C:
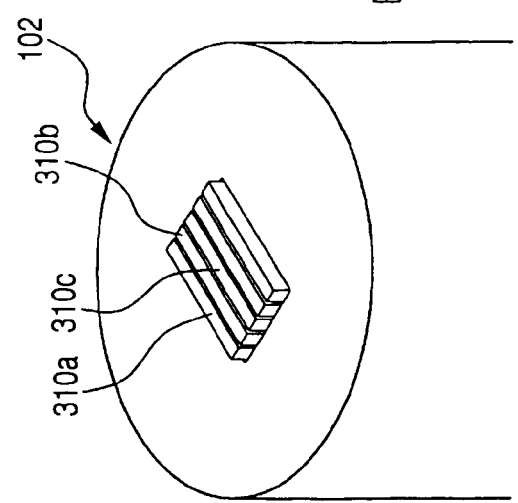

To peel off the chip 1 using these blocks 310a to 310c, first of all, as shown in FIG. 34(a), five blocks 310a to 310c are simultaneously pushed upwardly, and, thereafter, as shown in FIG. 34(b), the two intermediate blocks 310b and the one inner block 310c are further pushed upward, and, finally, as shown in FIG. 34(c), the one inner block 310c is pushed further upward. Alternatively, as in the case of the embodiment 2, the blocks 310a to 310c may be simultaneously pushed upward, and, thereafter, the outer blocks 310a pushed downward and, next, the intermediate blocks 310b may be lowered.

In this embodiment, since the lengths of the long sides of the blocks 310a to 310c are equal, a uniform load cannot be applied to the whole chip, and, particularly, there exists a possibility that the inner block 310c will apply a large load to the short-side peripheral portion of the chip 1; and, hence, when the size of the chip 1 is large, or when the tackiness of the pressure sensitive adhesive applied to the dicing tape 4 is strong, the chip 1 is liable to easily crack. Further, since the area of the inner block 310c becomes larger compared to the example shown in FIG. 31, it is desirable to facilitate the peeling-off of the chip 1 from the dicing tape 4 by decreasing the area by forming fillets on the outer periphery (corner portions) of the upper surface of the block 310c, for example.

Figure 35:
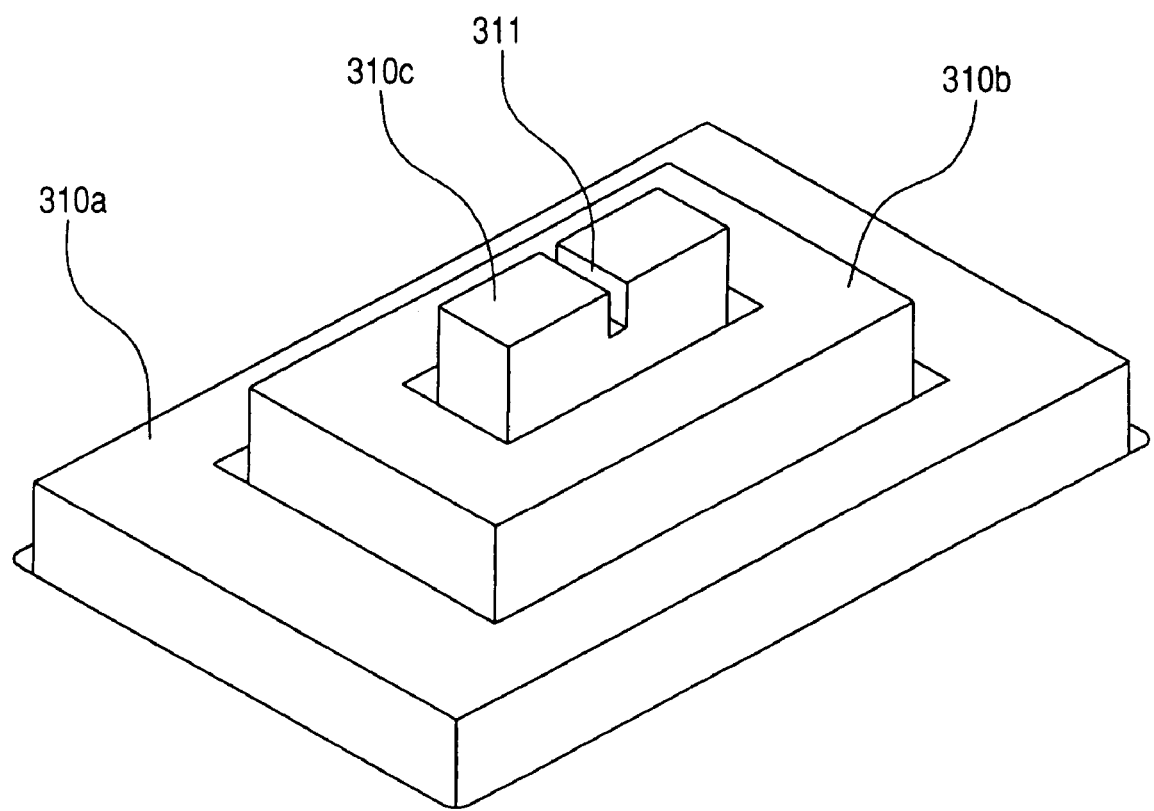
FIG. 35 is an enlarged perspective view of the vicinity of an upper surface of a suction block of another embodiment of the present invention.
Figure 36:
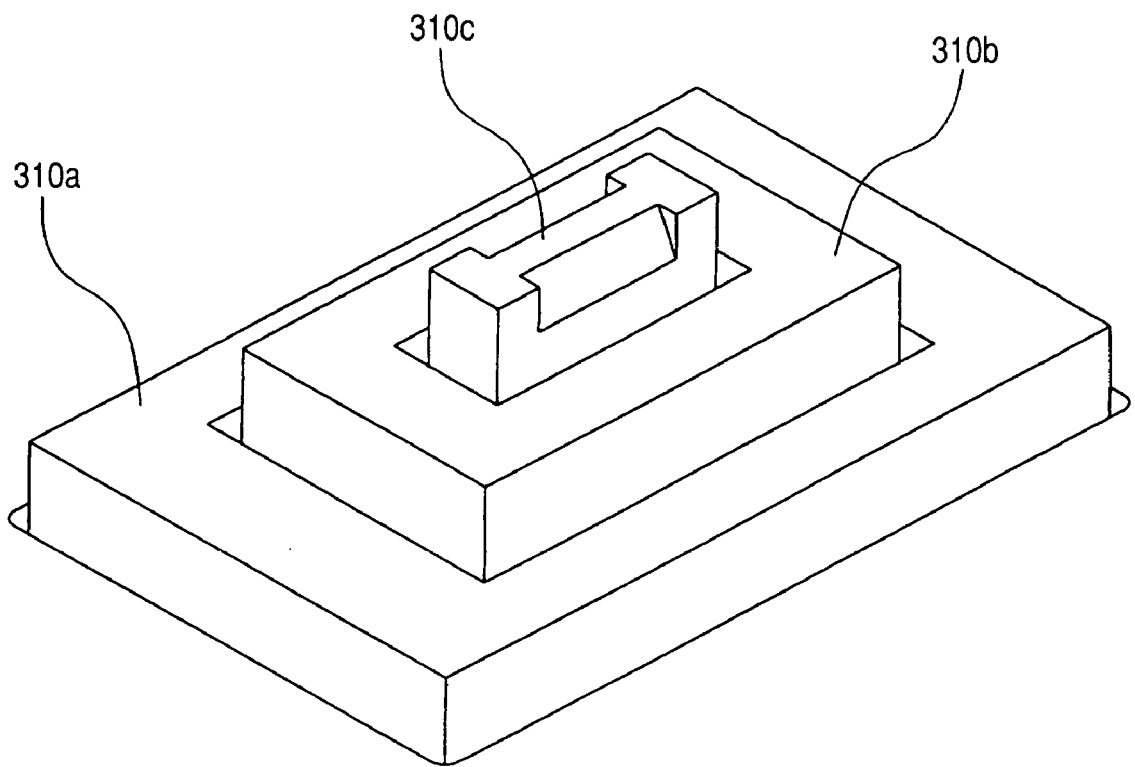
FIG. 36 is an enlarged perspective view of the vicinity of an upper surface of a suction block of another embodiment of the present invention.

As a method of decreasing the area of the inner block 310c, it is also possible to adopt a method which provides notched grooves 311 at the center portion of the block 310c, as shown in FIG. 35, for example, or a method which sets the width of the center portion of the block 310c narrower than the width of both end portions, as shown in FIG. 36.

Figure 37:
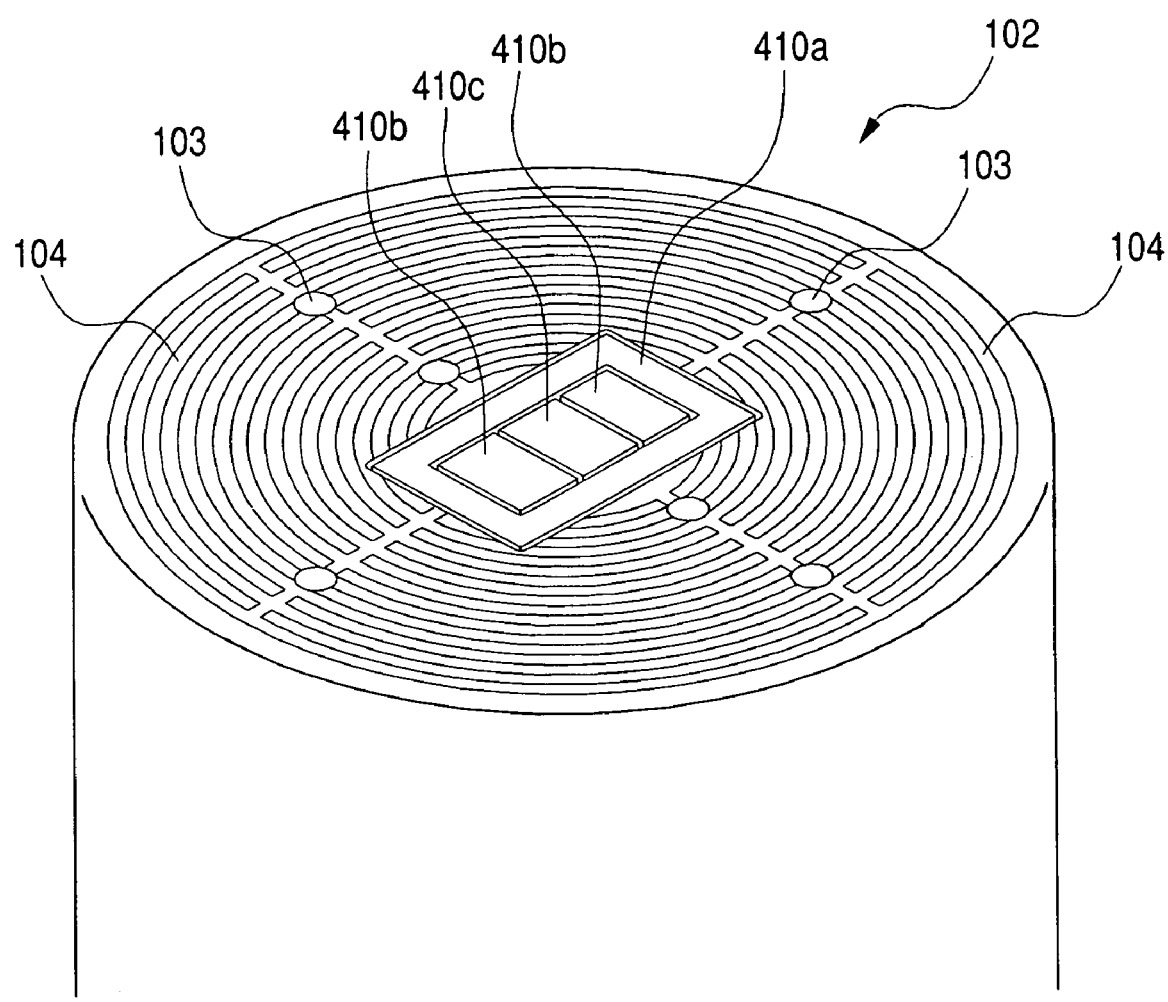
FIG. 37 is an enlarged perspective view of the vicinity of an upper surface of a suction block of another embodiment of the present invention.

FIG. 37 shows an example in which three rectangular blocks are arranged in the inside of an outer block 410a, and the three rectangular blocks are arranged along the long-side direction of the rectangular chip 1, wherein one center block constitutes the inner block 410c and two blocks on both sides of the inner block 410c constitute the intermediate blocks 410b, respectively.

Figure 38A:
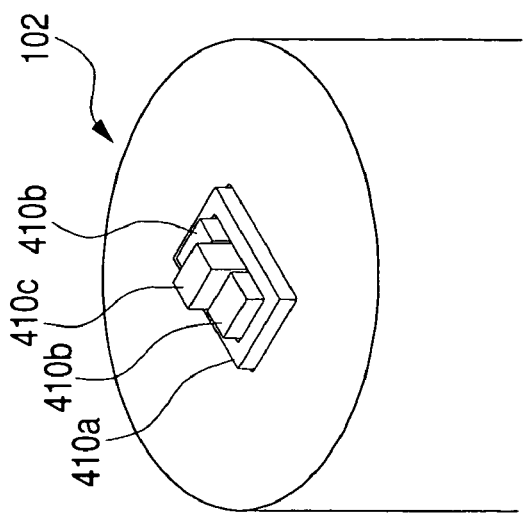
FIG. 38(a) to FIG. 38(c) are perspective views of the vicinity of an upper surface of a suction block, illustrating the method of peeling semiconductor chips using the suction block shown in FIG. 37.
Figure 38B:
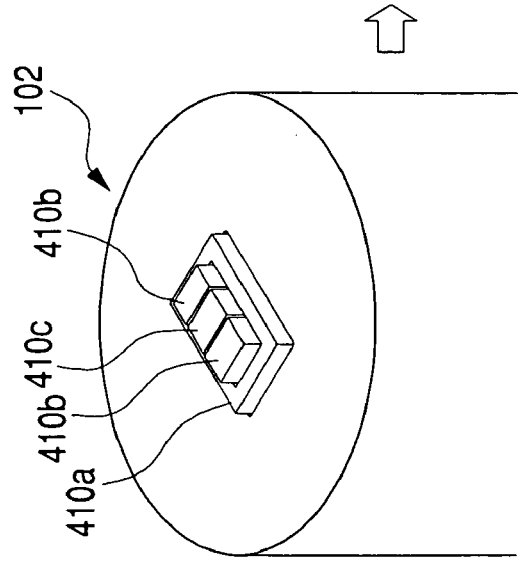
Figure 38C:
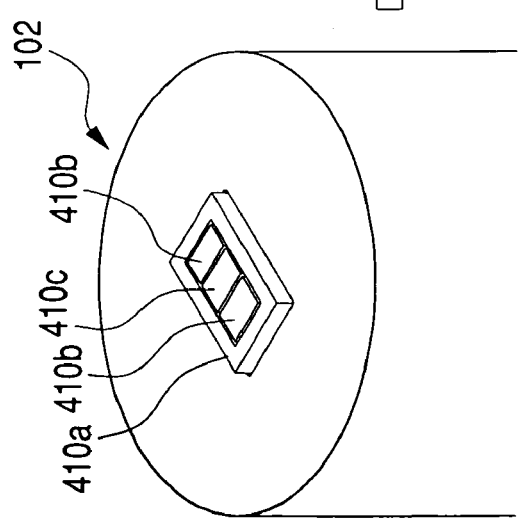

To peel off the chip 1 using these blocks 410a to 410c, first of all, as shown in FIG. 38(a), four blocks 410a to 410c are simultaneously pushed upwardly, and, thereafter, as shown in FIG. 38(b), two intermediate blocks 410b and one inner block 410c are further pushed upward, and, finally, as shown in FIG. 38(c), one inner block 410c is further pushed upward. Alternatively, as in the case of the embodiment 2, four blocks 410a to 410c are simultaneously pushed upward, and, thereafter, the outer blocks 410a are pushed downward, and, next, the two intermediate blocks 410b may be lowered.

In this embodiment, most of the chip 1 is peeled off in the step shown in FIG. 38(a) and in the step shown in FIG. 38(b), and the region having a minimum area which prevents cracking of the chip 1 is peeled off in the step shown in FIG. 38(c). By allowing the intermediate block 410b and the inner block 410c to have the same upper surface area, machining of the blocks 410b and the block 410c is facilitated.

(Embodiment 4)

Figure 39:
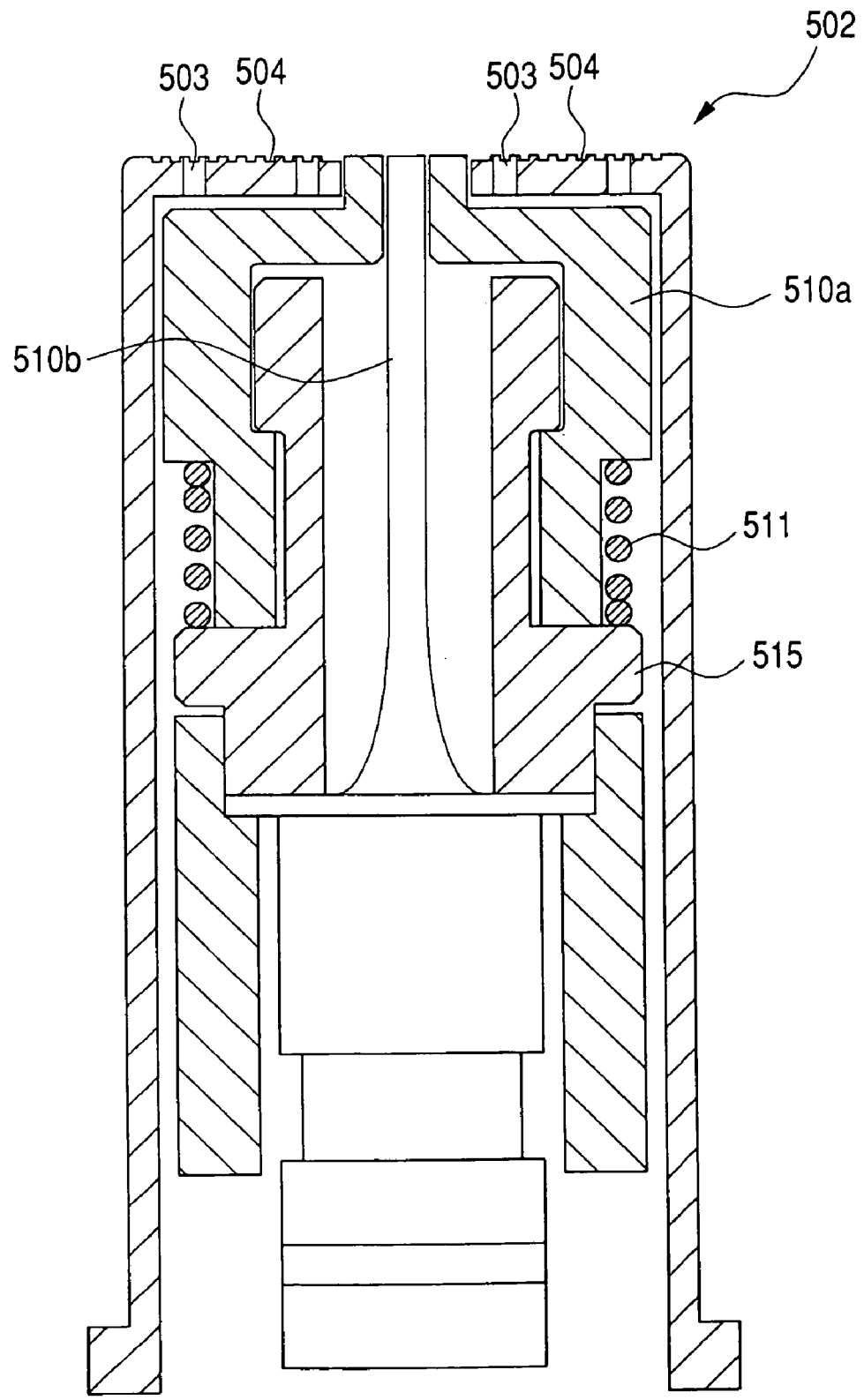
FIG. 39 is a cross-sectional view of a suction block of another embodiment of the present invention.
Figure 40:
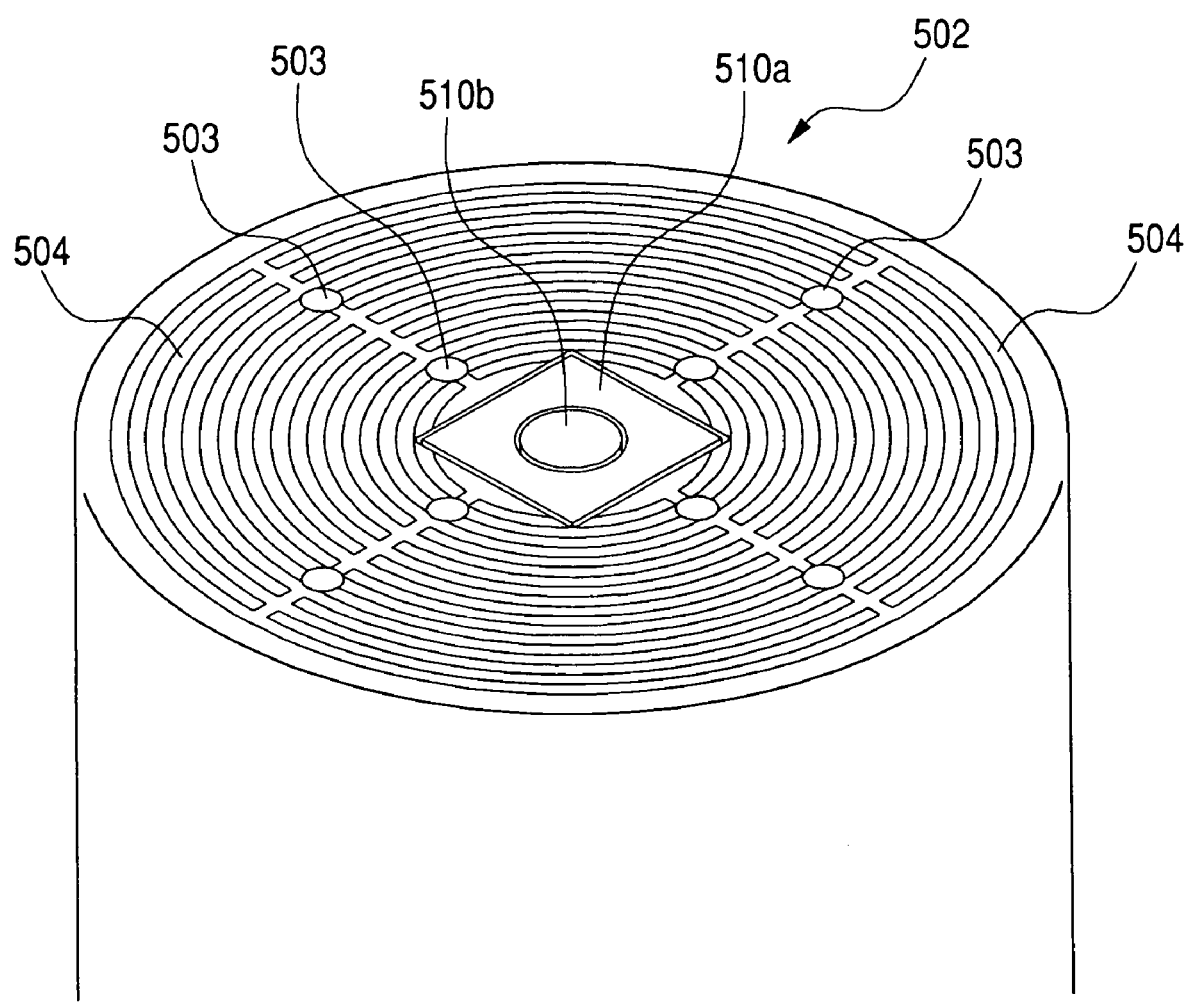
FIG. 40 is an enlarged perspective view of the vicinity of an upper surface of the suction block shown in FIG. 39.

FIG. 39 is a cross-sectional view of a suction block 502 according to this embodiment, and FIG. 40 is an enlarged perspective view of the vicinity of the upper surface of the suction block 502.

A block 510a is arranged at a center portion of the suction block 502, and a vibration block 510b, which has a diameter that is smaller than the diameter of the block 510a, is arranged in the inside of the block 510a.

To a peripheral portion of an upper surface of the suction block 502, a plurality of suction ports 503 and a plurality of concentric grooves 504 are provided. In the same manner as the suction block 102 of the embodiment 1, the respective pressures inside the suction ports 503 and the grooves 504 are reduced by a suction mechanism (not shown in the drawing) at the time the suction block 502 is elevated and the upper surface thereof is brought into contact with a back surface of the dicing tape 4. As a result, the back surface of the dicing tape 4 is sucked downwardly and is closely adhered to the upper surface of the suction block 502.

The outer block 510a has substantially the same structure and functions as the outer block 110a having the largest diameter among the three blocks 110a to 110c which are incorporated into the suction block 102 of the above-mentioned embodiment. Although it is preferable that the size of the block 510a is slightly smaller (for example, approximately 0.5 mm to 3 mm) than the size of the chip 1 which represents the object to be peeled, the size of the block 510a may be smaller than the size of the chip 1 by 3 mm or more, or, conversely, it may be larger than the size of the chip 1. Further, it is preferable that the shape of the upper surface of the block 510a may be formed in a square shape when the chip 1 has a square shape, and it may be formed in a rectangular shape when the chip 1 has a rectangular shape.

Figure 41:
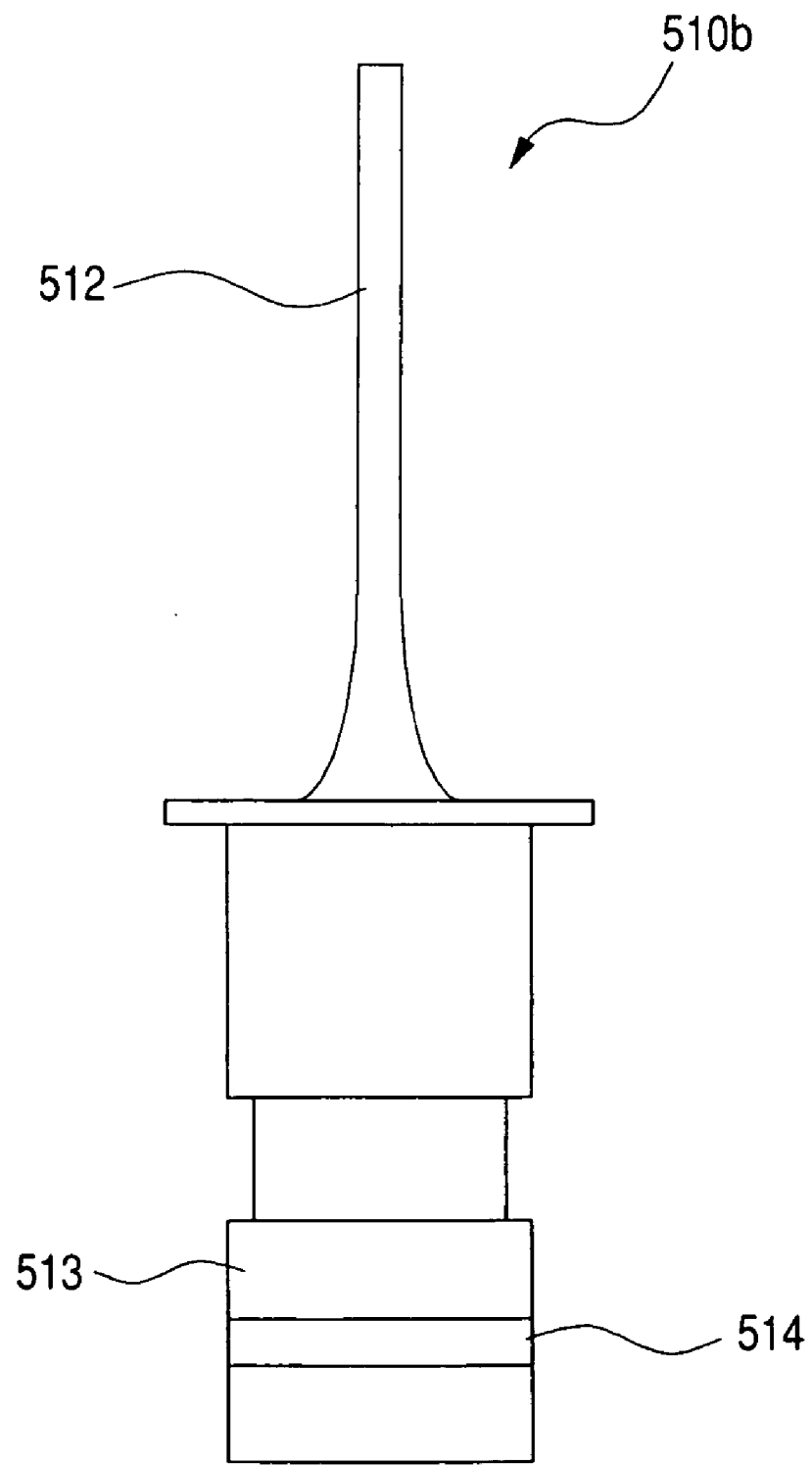
FIG. 41 is a side view showing a profile of a vibration block mounted on the suction block shown in FIG. 39.

FIG. 41 is a side view showing the profile of the vibration block 510b, which is arranged in the inside of the above-mentioned block 510a. The vibration block 510b is constituted of a circular columnar vibrator 512 and a resonance portion 513, which is fixed to one end of the vibrator 512. The resonance portion 513 is a portion which resonates in accordance with vertical vibrations generated by a piezoelectric element 514 incorporated into the resonance portion 513, which amplifies the vibration. The distal end portion thereof is brought into contact with the lower surface of the dicing tape 4 so that the vibration in the vertical direction (direction perpendicular to the lower surface of the dicing tape 4) is applied to the dicing tape 4.

The preferred oscillation frequency of the vibrator 512 is within a range of 1 kHz to 100 kHz and the preferred amplitude of the vibrator 512 is 1 μm to 50 μm. Although a frequency of less than 1 kHz may be sufficient to peel off the chip 1, a considerable time is necessary for peeling, and, hence, the use of such a frequency is not practical. In the same manner, although an amplitude of less than 1 μm may be sufficient to peel off the chip 1, a considerable time is necessary for peeling. On the other hand, when the frequency exceeds 100 kHz, the side effects including an increase of the heat value of the dicing tape 4 due to the vibration energy or the like will become apparent. Further, when the amplitude exceeds 50 μm, particularly when the chip 1 is extremely thin, crack tend to occur and the integrated circuit may be damaged. In this embodiment, the oscillation frequency of the vibrator 512 is set to 60 kHz, and the amplitude of the vibrator 512 is set to 20 μm.

In this manner, two blocks (block 510a, vibration block 510b) are incorporated into the suction block 502 of this embodiment. Further, the vibration block 510b, which is arranged inside the block 510a, is configured to apply a vibration in the vertical direction to the dicing tape 4.

Figure 42:
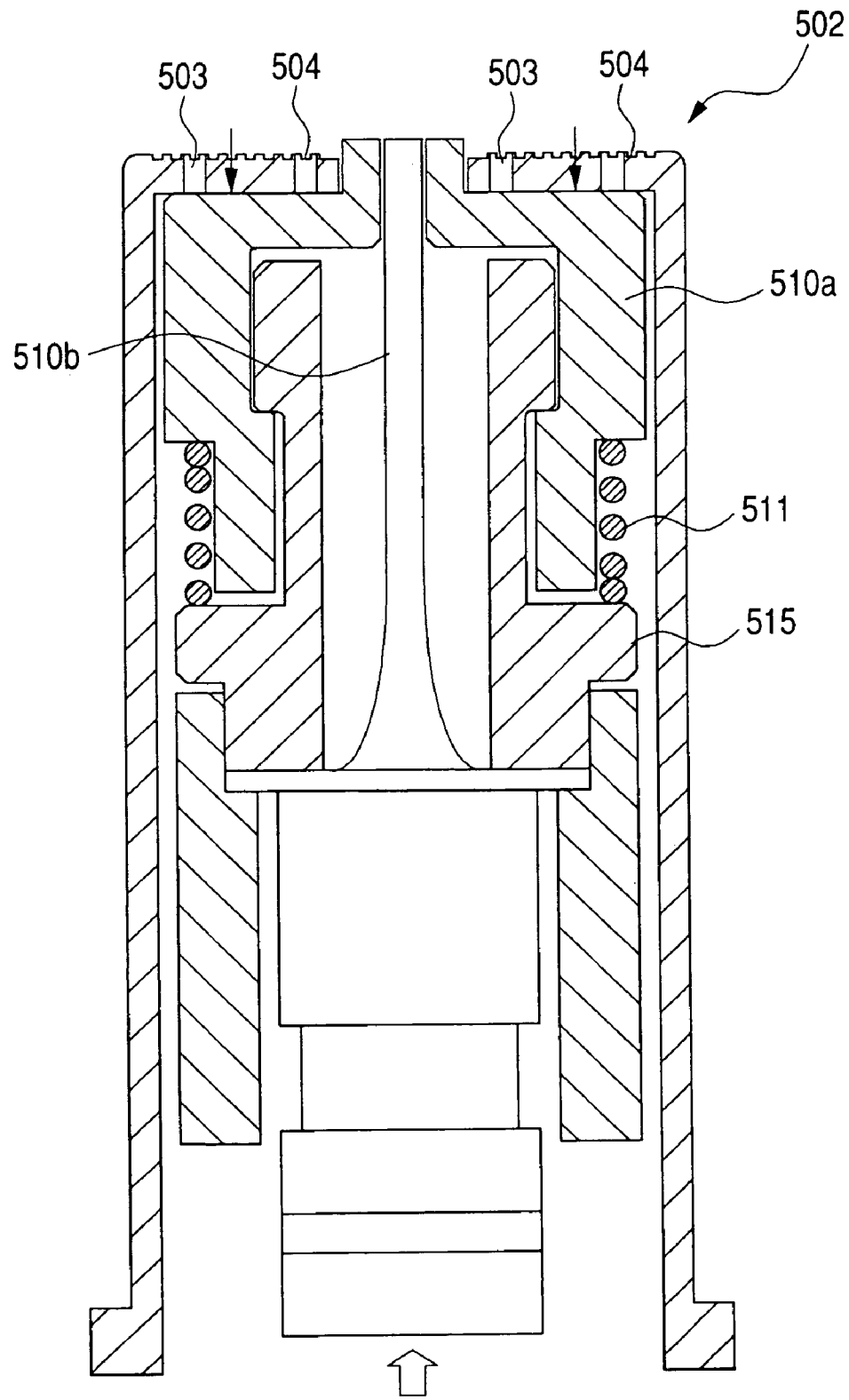
FIG. 42 is an enlarged cross-sectional view of the vicinity of the upper surface of the suction block, illustrating a method of peeling the semiconductor chips.

The mechanism which pushes the block 510a and the vibration block 510b upwardly is substantially the same as the mechanism which was explained in conjunction with the above-mentioned embodiment 1. That is, to simultaneously push the block 510a and the vibration block 510b upwardly, as shown in FIG. 42, the vibration block 510b is pushed upwardly using a driving mechanism (not shown in the drawing) which is connected to the vibration block 510b. Accordingly, the block 510a is also pushed up due to the spring force of the compression coil spring 511, which is interposed between a stopper 515 fixed to the vibration block 510b and the block 510a. Further, when a portion (a portion indicated by arrows in the drawing) of the block 510a is brought into contact with a peripheral portion of the suction block 502, the upward movement of the block 510a and the vibration block 510b is stopped.

Figure 43:
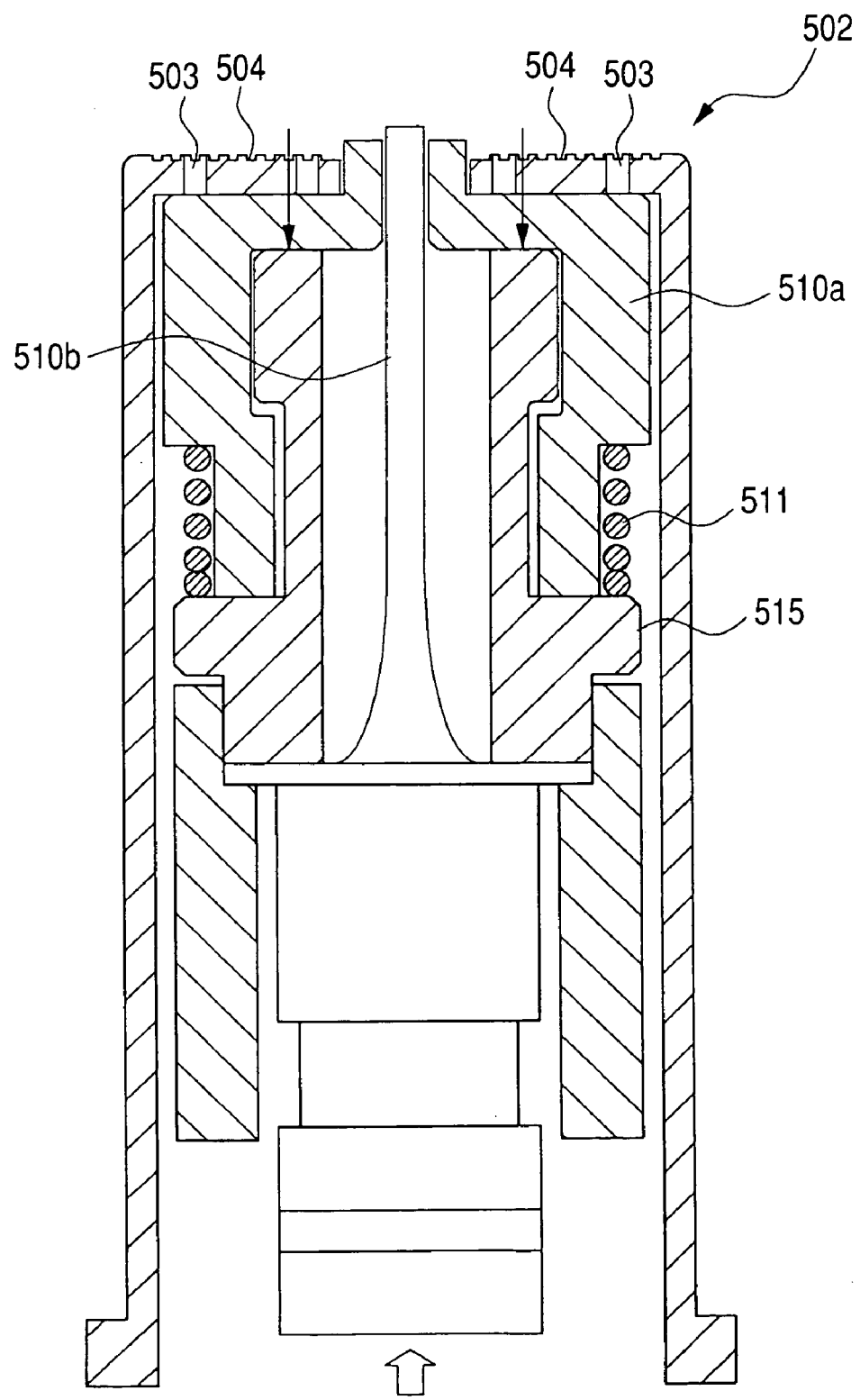
FIG. 43 is an enlarged cross-sectional view of the vicinity of the upper surface of the suction block, illustrating the method of peeling the semiconductor chips.

Subsequently, as shown in FIG. 43, when the vibration block 510b is further pushed up with a force sufficiently strong to contract the compression coil spring 511, the upper surface of the vibration block 510b is pushed above the upper surface of the block 510a. Then, when the upper end portion (a portion indicated by an arrow in the drawing) of the stopper 515 is brought into contact with the peripheral portion of the suction block 502, the upward movement of the vibration block 510b is stopped.

Next, the method for peeling off the chip 1 from the dicing tape 4 using the above-mentioned suction block 502 will be explained in conjunction with FIG. 44 to FIG. 48. Here, the chip 1 which represents the object to be peeled is a chip 1 having a square shape to the chip used in the above-mentioned embodiment 1. Further, the dicing tape 4 is a UV curing type adhesive tape, which is the same as the adhesive tape used in the above-mentioned embodiment 1. As the block 510a, in the same manner as the block 110a of the above-mentioned embodiment 1, a block having a diameter slightly smaller (for example, approximately 0.5 mm to 3 mm) than the chip 1 which represents the object to be peeled is used.

Figure 44:
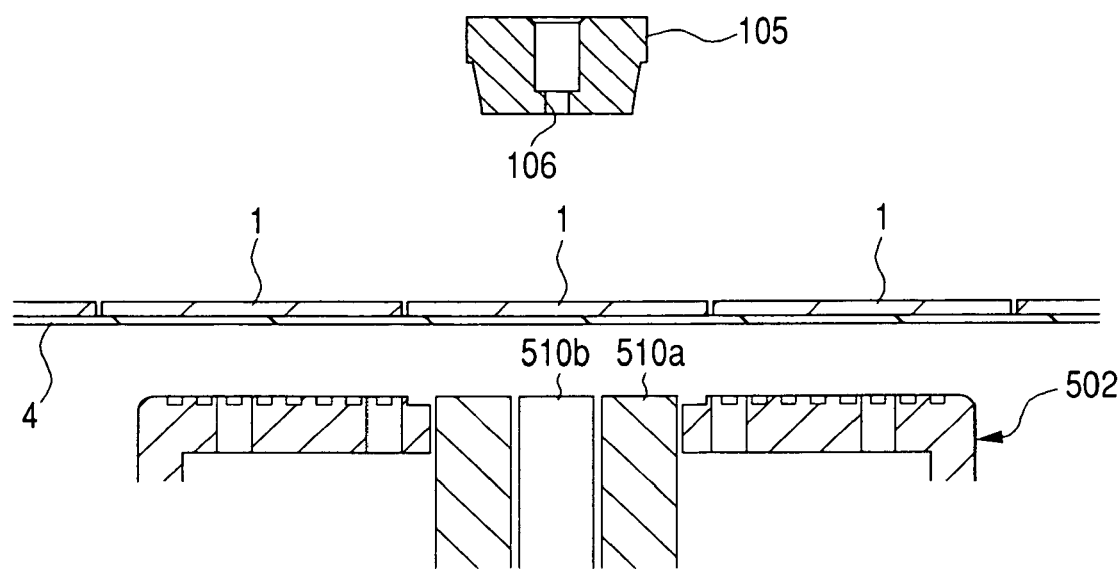
FIG. 44 is an enlarged cross-sectional view of the vicinity of the upper surface of the suction block, illustrating the method of peeling the semiconductor chips.

First of all, as shown in FIG. 44, a center portion (the block 510a and the vibration block 510b) of the suction block 502 is moved to a position right below one chip 1 which represents the object to be peeled (the chip 1 positioned at a center portion of the drawing), and, at the same time, the suction collet 105 is moved to a position above the chip 1. Here, the block 510a and the vibration block 510b are adjusted such that the heights of the respective upper surfaces thereof become equal. Further, at this point in time, the vibration block 510b is not vibrated.

Figure 45:
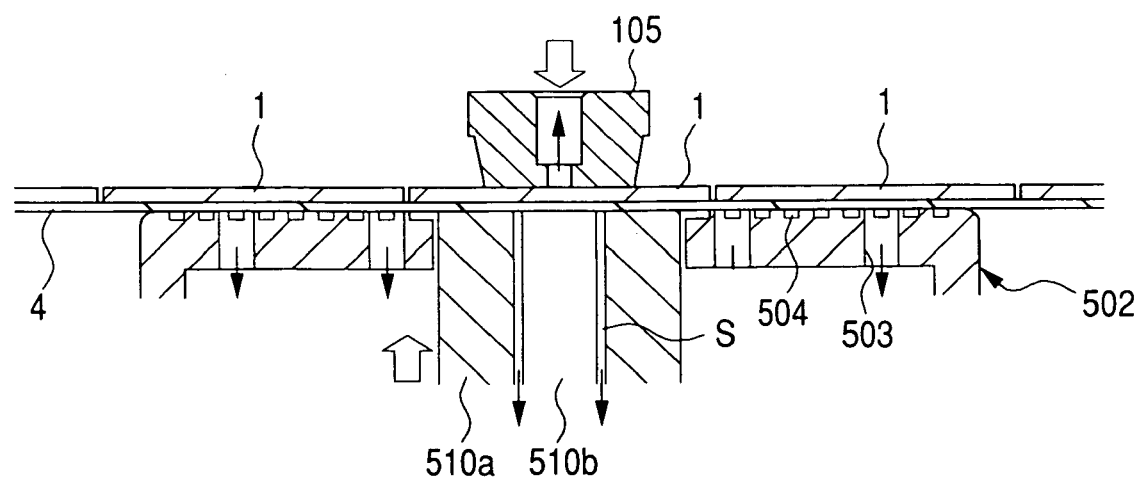
FIG. 45 is an enlarged cross-sectional view of the vicinity of the upper surface of the suction block, illustrating the method of peeling the semiconductor chips.

Next, as shown in FIG. 45, the suction block 502 is elevated so as to bring the upper surface of the suction block 502 into contact with the back surface of the dicing tape 4, and, at the same time, the pressure in the inside of the suction ports 503, grooves 504 and gaps (S) is reduced. Accordingly, the dicing tape 4 which is brought into contact with the chip 1 is brought into close contact with the respective upper surfaces of the block 510a and the vibration block 510b.

Figure 46:
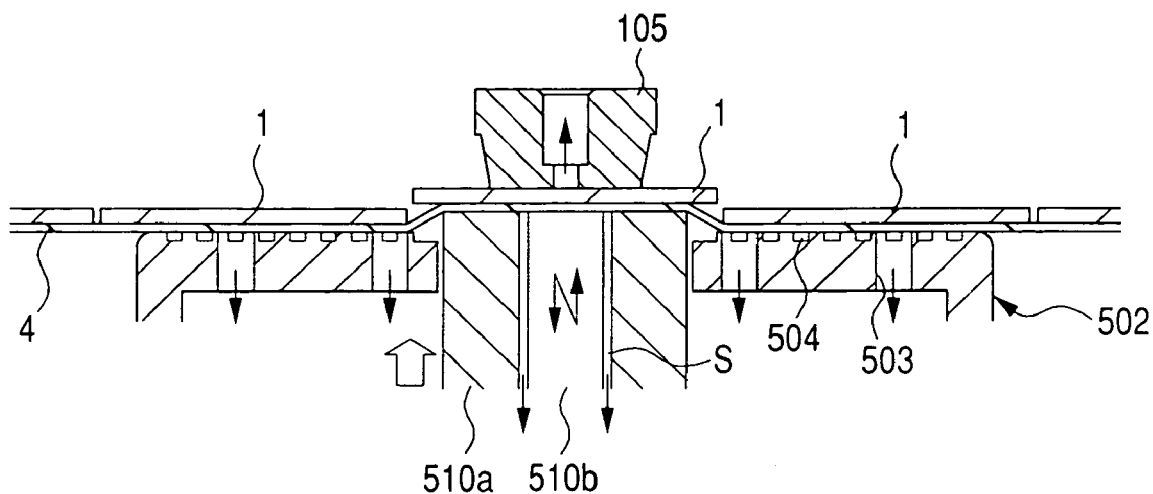
FIG. 46 is an enlarged cross-sectional view of the vicinity of the upper surface of the suction block, illustrating the method of peeling the semiconductor chips.

Next, as shown in FIG. 46, a load in the upward direction is applied to the back surface of the dicing tape 4 by simultaneously pushing the block 510a and the vibration block 510b upwardly, and, hence, the chip 1 and the dicing tape 4 are pushed up. Further, along with such an operation, the vibration block 510b is vibrated so as to apply a vibration in the vertical direction to the dicing tape 4.

As described above, by applying the vibration in the vertical direction to the dicing tape 4 by bringing the vibration block 510b into contact with the lower surface of the dicing tape 4, vibrations are transmitted to an outer peripheral portion of the chip 1, which constitutes a peeling start point of the chip 1 and the dicing tape 4. As a result, the peeling of the chip from the dicing tape 4 rapidly progresses in a region outside an outer periphery (corner portions) of the upper surfaces of the block 510a.

Here, in the step shown in FIG. 46, during the operation in which the block 510a and the vibration block 510b are simultaneously pushed upwardly, the vibration may be applied using the vibration block 510b. When the vibration block 510b is vibrated in the vertical direction in a state in which the heights of the upper surfaces of the block 510a and the vibration block 510b are set equal, the upper surface of the vibration block 510b becomes higher than the upper surface of the block 510a by ½ (10 µm) of the amplitude of the vibration at a maximum. Accordingly, when the block 510a and the vibration block 510b are elevated and the vibration block 510b is vibrated in the vertical direction in a state in which the upper surface of the vibration block 510b is preliminarily set higher than the upper surface of the block 510a by ½ of the amplitude or more, the vibration energy is effectively transmitted to the chip 1 by way of the dicing tape 4. Further, by preliminarily setting the upper surface of the vibration block 510b higher than the upper surface of the block 510a within a range of 0 to ½ of the amplitude, amount of vibration energy transmitted to the dicing tape 4 can be finely adjusted.

Figure 47:
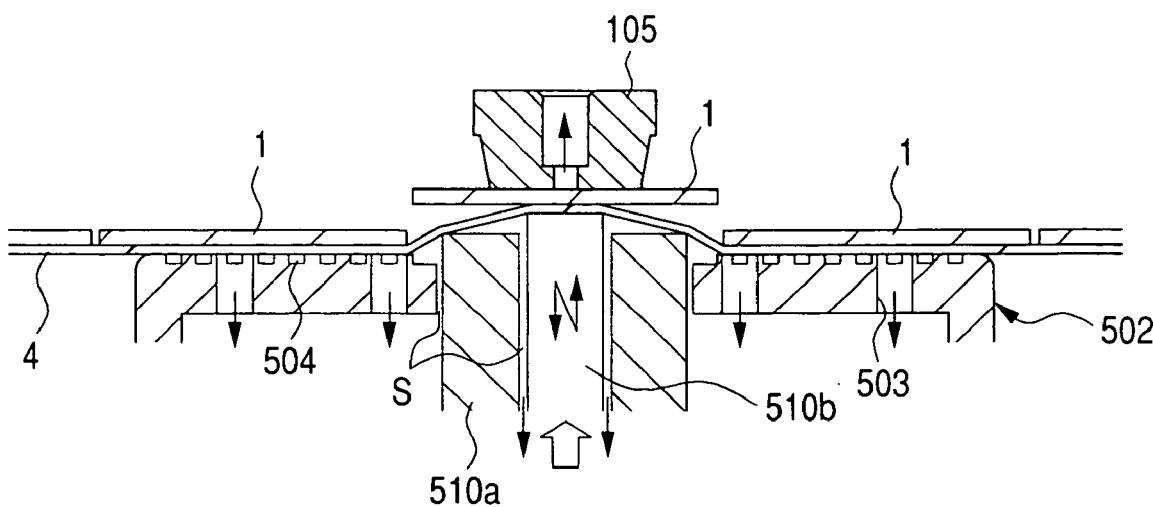
FIG. 47 is an enlarged cross-sectional view of the vicinity of the upper surface of the suction block, illustrating the method of peeling the semiconductor chips.

Next, as shown in FIG. 47, the vibration block 510b is further pushed upward while vibrating thus pushing up the back surface of the dicing tape 4. Accordingly, the peeling of the chip 1 and the dicing tape 4 further progresses, and the contact region between the chip 1 and the dicing tape 4 is merely constituted of a narrow region in the center portion of the chip 1, and, hence, the chip 1 is peeled off from the dicing tape 4 merely in response to the suction force of the suction collet 105.

Figure 48:
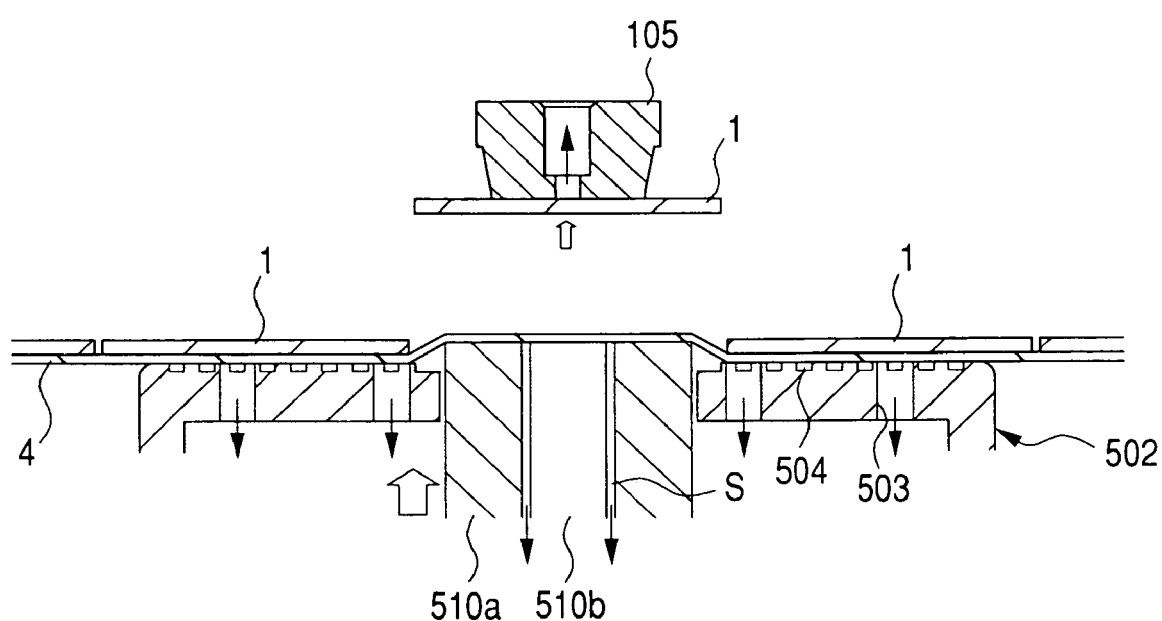
FIG. 48 is an enlarged cross-sectional view of the vicinity of the upper surface of the suction block, illustrating the method of peeling the semiconductor chips.

Next, as shown in FIG. 48, by stopping the vibration of the vibration block 510b and pulling the vibration block 510b downward, and, at the same time, by pulling the suction collet 105 which sucks the chip 1 upward, the operation to peel off the chip 1 from the dicing tape 4 is completed.

In this manner, by applying the vibration in a direction perpendicular to the adhesive interface between the chip 1 and the dicing tape 4 at the time of peeling off the chip 1 from the dicing tape 4, the peeling can be enhanced, whereby the operation to peel off the chip 1 can be performed rapidly compared to the method which peels off the chip 1 from the dicing tape 4 by merely pushing up the blocks 110a to 110c, as described in the above-mentioned embodiment 1.

Further, when the load in the upward direction is applied to the back surface of the dicing tape 4 by simultaneously pushing the three blocks 110a to 110c upward, as in the case of the above-mentioned embodiment 1, a limited peeling amount of the chip 1 and the dicing tape 4 of approximately 0.7 mm is achieved toward the inside from the outermost peripheral portion of the chip 1 at a maximum (when the uv curing type adhesive tape is being used). On the contrary, when a vibration in the vertical direction is applied to the dicing tape 4 at the time of applying the load in the upward direction to the back surface of the dicing tape 4 by simultaneously pushing up the block 510a and the vibration block 510b, as in the case of this embodiment, the peeling amount of the chip 1 from the dicing tape 4 is increased to approximately 2 mm to 3 mm at a maximum toward the inside from the outermost peripheral portion of the chip 1.

In this manner, according to this embodiment, compared to the method which peels off the chip 1 from the dicing tape 4 by merely pushing up the blocks 110a to 110c, as in the case of the above-mentioned embodiment 1, the number of blocks can be reduced, and, hence, the number of parts of the suction block can be reduced.

Further, according to this embodiment, since the peeling amount of the chip 1 from the dicing tape 4 which is obtained by one pushing step is increased, even when the size and the shape of the chip 1 is changed, the frequency of exchange frequency of the block 510a and the vibration block 510b can be reduced. That is, since the time and effort for exchanging the blocks when the size and the shape of the chip 1 are changed can be reduced, the versatility of the suction block can be enhanced.

Further, by adopting a method which accelerates the peeling-off of the chip 1 by applying a vibration to the adhesive interface between the chip 1 and the dicing tape 4, as in the case of this embodiment, the amount of the stroke of the outer block can be reduced compared to the above-mentioned embodiment 1. Accordingly, when the outer block is pushed up, the dicing tape 4 below a chip next to the chip 1 which represents the object to be peeled is lifted, and, hence, the drawback that the chip 1 cracks can be suppressed.

Although the invention made by the inventors has been specifically explained based on the above-mentioned embodiments heretofore, it is needless to say that the present invention is not limited to the above-mentioned embodiments, and various modifications can be made without departing from the gist of the invention.

Although an explanation has been made with respect to a case in which the dicing tape is the UV curing type adhesive tape in the above-mentioned embodiments 1 to 4, the push-up method which has been explained in conjunction with the embodiments 1 to 3 is also applicable to a case in which the dicing tape is a non-UV curing type adhesive tape.

Further, as shown in FIG. 24, while the chip 1 which is peeled off from the dicing tape 4 is mounted on the printed circuit wiring board 11 by way of the adhesive 10, it may be possible to adopt a method in which an adhesive-attached tape, which is referred to as a die attach film, is preliminarily laminated to the back surface of the chip 1 and the chip 1, is adhered to the printed circuit wiring board 11 by heating the die attach film.

In this case, the die attach film is laminated to the back surface of the wafer, the dicing is performed in a state in which the dicing tape is laminated to the die attach film, and, thereafter, the chip provided with the die attach film is peeled off from the dicing tape. The push-up method which has been explained in conjunction with the above-mentioned embodiments 1 to 3 is also applicable to the case in which the chip provided with the die attach film is peeled off from the dicing tape.

On the other hand, when the dicing tape is the non-UV curing type adhesive tape, when a vibration is applied to the chip which is peeled off from the tape by pushing up the block, the chip and the tape may become adhered to each other again due to the vibration, and, hence, an advantageous effect to enhance the peeling speed using vibrations cannot be largely expected with this type of tape. Accordingly, when the chip is peeled off from the non-UV curing type adhesive tape using a suction block adopting a push-up/vibration combination method, which has been explained in conjunction with the embodiment 4, it is sufficient to peel off the chip by merely pushing up the two blocks (the block 510a, the vibration block 510b), without applying a vibration to the vibration block (510b).

Further, when an adhesive film having an low elastic modulus is laminated to the back surface of the chip, as in the case of a chip provided with a die attach film, when the vibration is applied to the adhesive film, a part of the vibration energy is converted into heat energy, so that the temperature of the adhesive film is elevated, and, hence, the adhesive film experiences a further decrease in elasticity and becomes highly adhesive, whereby the peeling of the film from the dicing tape becomes difficult.

Accordingly, when a chip provided with a die attach film is peeled off from the dicing tape using a suction block adopting the push-up/vibration combination method, which has been explained in conjunction with the above-mentioned embodiment 4, it is sufficient to peel off the film and the dicing tape by merely pushing up the block (or a combination of pushing up the block and the use of a weak vibration) and to apply a strong vibration at a point of time when the contact area between the film and the dicing tape becomes small, so as to facilitate the peeling-off. Particularly, when the size of the chip which represents the object to be peeled is small, and, hence, the contact area between the film and the dicing tape is small, the vibration energy is converted into heat energy and the peeling is completed before the temperature of the adhesive is elevated. Hence, a suction block which adopts the push up/vibration combination method of the embodiment 4 can perform peeling within a period shorter than that of the suction block which adopts the single push-up method.

Although the case in which the invention is applied to a thin chip having a thickness of several tens μm has been explained in conjunction with the above-mentioned embodiments, the present invention may be applicable to a chip having a thickness of 100 μm or more.

When a chip which has the possibility of giving rise to a problem attributed to the irradiation of ultraviolet rays, such as a flash memory, for example, is used as the chip 1, it is desirable to particularly use the non-UV curing type adhesive tape for eliminating the ultraviolet ray irradiation step prior to the peeling step. Further, with respect to a semiconductor device which adopts a flash memory, due to the demand for large capacity in the flash memory, there may be a case in which the chip is mounted in a stacked manner. To realize a reduction of the thickness of the chip 1 which is required in such a case, the present invention is applicable, and the present invention is highly inevitable for attenuating a bending stress applied to the chip 1 during the peeling step.

The present invention provides a technique which is effectively applicable to a method in which respective semiconductor chips are peeled off from an adhesive tape after dividing the semiconductor wafer laminated to the adhesive tape into a plurality of semiconductor chips by dicing during semiconductor manufacture.

What is claimed is:

1. A method of manufacturing semiconductor device including the steps of:
   adhering an adhesive tape to a back surface of a semiconductor wafer formed with integrated circuits over a main surface thereof, and thereafter dicing the semiconductor wafer to thereby divide the semiconductor wafer into a plurality of semiconductor chips; and
   applying an upward load to the adhesive tape below the semiconductor chip which becomes an object to be peeled off, among the plurality of semiconductor chips adhered to the adhesive tape, in a state that an upper surface of the semiconductor chip which becomes an object to be peeled off is sucked and held by a suction collet, to thereby peel off the semiconductor chip from the adhesive tape,
   wherein the step of applying the load to the adhesive tape includes:
   a step of preparing a first pusher block having a first upper surface and a corner portion around the first upper surface, and a second pusher block having a second upper surface which is arranged inside the first upper surface and a corner portion around the second upper surface;
   a first step of pushing the adhesive tape upwardly by making the first and second upper surfaces simultaneously push up the back surface of the adhesive tape; and
   a second step of further pushing the adhesive tape upwardly by pushing up the second upper surface higher than the first upper surface after the first step.

2. A method of manufacturing semiconductor device according to claim 1, wherein the adhesive tape is formed of a tape substrate and a pressure sensitive adhesive which is applied to one surface of the tape substrate.

3. A method of manufacturing semiconductor device according to claim 1, wherein a thickness of the semiconductor chips is 100 μm or less.

4. A semiconductor device manufacturing method according to claim 1, wherein an area of the first and second upper surfaces is smaller than an area of the semiconductor chips.

5. A method of manufacturing semiconductor device according to claim 1, wherein a gap is defined between the first and second pusher blocks, and the adhesive tape formed over a back surface of the semiconductor chip is sucked downwardly by reducing pressure inside the gap at the time of applying the load to the semiconductor chips.

6. A method of manufacturing semiconductor device according to claim 1, wherein in the step of applying the load to the adhesive tape, the adhesive tape over a back surface of other semiconductor chip adjacent to the semiconductor chip which become an object to be peeled off is sucked downwardly.

7. A method of manufacturing semiconductor device according to claim 1, wherein the first upper surface and the second upper surface are flat.

8. A method of manufacturing semiconductor device according to claim 4, wherein the semiconductor chips have a rectangular shape with a longitudinal length and a lateral length which differ from each other, and the upper surface of the first pusher block has a rectangular shape with a longitudinal length and a lateral length which differ from each other.

9. A method of manufacturing semiconductor device according to claim 1, wherein a radius of curvature of the first upper surface and a radius of curvature of the second upper surface are respectively larger than radii of curvature of the corner portions of the respective upper surfaces.

10. A method of manufacturing semiconductor device according to claim 1, wherein a pushing time of the adhesive tape by the second upper surface is shorter than a pushing time of the adhesive tape by the first upper surface.

11. A method of manufacturing semiconductor device according to claim 1, wherein a pushing speed of the adhesive tape by the second upper surface is slower than a pushing speed of the adhesive tape by the first upper surface.

12. A method of manufacturing semiconductor device according to claim 1, wherein in applying the load to the adhesive tape using the plurality of pusher blocks, the load is applied to the semiconductor chip downwardly by bringing the suction collet which sucks and holds the semiconductor chip into pressure contact with the upper surface of the semiconductor chip.

13. A method of manufacturing semiconductor device according to claim 4, wherein following the step of pushing the second upper surface, the suction collet which sucks and holds the semiconductor chip is pulled upwardly and, thereafter, the second pusher block is lowered downwardly.

14. A method of manufacturing semiconductor device according to claim 8, wherein notched grooves are formed in portions of the second upper surface.

15. A method of manufacturing semiconductor device according to claim 8, wherein the second upper surface has a rectangular shape and a width of a center portion of the upper surface is narrower than widths of other portions of the upper surface.

16. A method of manufacturing semiconductor device according to claim 1, wherein an area of portions where the upper surface of the semiconductor chip and the suction collet are brought into contact with each other is set larger than an area of the second upper surface of the second pusher block.

17. A method of manufacturing semiconductor device according to claim 1,
wherein the method further includes a third step of pulling the semiconductor chips upwardly using a suction force of the suction collet after the second step, and a fourth step of pulling the second upper surface of the second pusher block downwardly, and
wherein the third step is performed prior to the fourth step.

18. A method of manufacturing semiconductor device according to claim 17, wherein a speed for pulling the semiconductor chip upwardly is set variable.

19. A method of manufacturing semiconductor device including steps of:
adhering an adhesive tape to a back surface of a semiconductor wafer formed with integrated circuits over a main surface thereof, and thereafter dicing the semiconductor wafer to thereby divide the semiconductor wafer into a plurality of semiconductor chips; and
applying an upward load and vibration to the adhesive tape below the semiconductor chip which becomes an object to be peeled off, among the plurality of semiconductor chips adhered to the adhesive tape, in a state that an upper surface of the semiconductor chip which becomes an object to be peeled off is sucked and held by a collet, to thereby peel off the semiconductor chip from the adhesive tape,
wherein the step of applying the load and the vibration to the adhesive tape includes:
a step of preparing a first pusher block having a first upper surface and a corner portion around the first upper surface, and a second pusher block having a second upper surface which is arranged inside the first upper surface, a corner portion around the second upper surface, and vibration means;
a first step of pushing the adhesive tape upwardly by making the first and second upper surfaces simultaneously push up the back surface of the adhesive tape;
a second step of applying the vibration to the adhesive tape by vibrating the second pusher block after the first step or simultaneously with the first step; and
a third step of further pushing the adhesive tape upwardly by pushing up the second upper surface higher than the first upper surface while vibrating the second pusher block after the second step.

20. A method of manufacturing semiconductor device according to claim 19, wherein the vibration is the longitudinal vibration in the direction perpendicular to a surface of the adhesive tape.

21. A method of manufacturing semiconductor device according to claim 19, wherein the frequency of the vibration is 1 kHz to 100 kHz and an amplitude of the vibration is 1 µm to 50 µm.

22. A method of manufacturing semiconductor device according to claim 20, wherein, in the first step, a height of the second upper surface is greater than a height of first upper surface by ½ or more of the amplitude of the longitudinal vibration.

23. A method of manufacturing semiconductor device according to claim 19, wherein the adhesive tape is formed of a tape substrate and a pressure surface adhesive which is applied to one surface of the tape substrate.

24. A method of manufacturing semiconductor device according to claim 19, wherein a thickness of the semiconductor chip is 100 µm or less.

25. A method of manufacturing semiconductor device according to claim 19, wherein a gap is defined between the first and second pusher blocks, and the adhesive tape formed on back surfaces of the semiconductor chips is sucked downwardly by reducing pressure inside the gap at the time of applying the load to the semiconductor chip.

* * * * *